(12) United States Patent
Anderson et al.

(10) Patent No.: US 8,736,019 B2
(45) Date of Patent: *May 27, 2014

(54) SEMICONDUCTOR DEVICES WITH SEALED, UNLINED TRENCHES AND METHODS OF FORMING SAME

(75) Inventors: Samuel Anderson, Tempe, AZ (US); Koon Chong So, Tempe, AZ (US)

(73) Assignee: Icemos Technology Ltd., Belfast (GB)

( * ) Notice: Subject to any disclaimer, the term of this patent is extended or adjusted under 35 U.S.C. 154(b) by 461 days.

This patent is subject to a terminal disclaimer.

(21) Appl. No.: 13/091,410

(22) Filed: Apr. 21, 2011

(65) Prior Publication Data

US 2011/0193176 A1 Aug. 11, 2011

Related U.S. Application Data

(63) Continuation of application No. 11/838,359, filed on Aug. 14, 2007, now Pat. No. 7,944,018.

(60) Provisional application No. 60/822,263, filed on Aug. 14, 2006, provisional application No. 60/822,261, filed on Aug. 14, 2006.

(51) Int. Cl.
*H01L 21/76* (2006.01)

(52) U.S. Cl.
USPC .................. 257/522; 438/421; 257/E21.545; 257/E21.564

(58) Field of Classification Search
USPC ............ 257/E21.545, E21.564, 522; 438/421
See application file for complete search history.

(56) References Cited

U.S. PATENT DOCUMENTS

| | | |
|---|---|---|
| 3,404,295 A | 10/1968 | Warner, Jr. |
| 3,497,777 A | 2/1970 | Teszner |
| 3,564,356 A | 2/1971 | Wilson |
| 4,754,310 A | 6/1988 | Coe |
| 4,775,881 A | 10/1988 | Ploog et al. |
| 4,821,095 A | 4/1989 | Temple |
| 4,868,624 A | 9/1989 | Grung et al. |
| 5,027,180 A | 6/1991 | Nishizawa et al. |
| 5,105,243 A | 4/1992 | Nakagawa et al. |
| 5,216,275 A | 6/1993 | Chen |
| 5,218,226 A | 6/1993 | Slatter et al. |
| 5,219,777 A | 6/1993 | Kang |
| 5,389,815 A | 2/1995 | Takahashi |
| 5,418,376 A | 5/1995 | Muraoka et al. |
| 5,430,311 A | 7/1995 | Murakami et al. |

(Continued)

FOREIGN PATENT DOCUMENTS

JP 52038889 A 3/1977

OTHER PUBLICATIONS

Office Action Issued Jan. 21, 2010 in U.S. Appl. No. 11/838,359.

(Continued)

*Primary Examiner* — Eva Yan Montalvo
(74) *Attorney, Agent, or Firm* — Panitch Schwarze Belisario & Nadel LLP

(57) ABSTRACT

A semiconductor device includes unlined and sealed trenches and methods for forming the unlined and sealed trenches. More particularly, a superjunction semiconductor device includes unlined, and sealed trenches. The trench has sidewalls formed of the semiconductor material. The trench is sealed with a sealing material such that the trench is air-tight. First and second regions are separated by the trench. The first region may include a superjunction Schottky diode or MOSFET. In an alternative embodiment, a plurality of regions are separated by a plurality of unlined and sealed trenches.

10 Claims, 45 Drawing Sheets

(56) References Cited

U.S. PATENT DOCUMENTS

| | | | |
|---|---|---|---|
| 5,438,215 A | 8/1995 | Tihanyi |
| 5,510,287 A | 4/1996 | Chen et al. |
| 5,519,245 A | 5/1996 | Tokura et al. |
| 5,572,048 A | 11/1996 | Sugawara |
| 5,998,292 A | 12/1999 | Black et al. |
| 6,011,298 A | 1/2000 | Blanchard |
| 6,066,878 A | 5/2000 | Neilson |
| 6,165,870 A | 12/2000 | Shim et al. |
| 6,300,171 B1 | 10/2001 | Frisina |
| 6,307,246 B1 | 10/2001 | Nitta et al. |
| 6,365,958 B1 | 4/2002 | Ibnabdeljalil et al. |
| 6,410,958 B1 | 6/2002 | Usui et al. |
| 6,497,777 B1 | 12/2002 | Huang |
| 6,534,379 B1 | 3/2003 | Fisher et al. |
| 6,812,525 B2 | 11/2004 | Bul et al. |
| 6,979,862 B2 | 12/2005 | Henson |
| 7,323,386 B2 | 1/2008 | Yilmaz |
| 7,405,452 B2 | 7/2008 | Yilmaz |
| 7,427,800 B2 | 9/2008 | Yilmaz |
| 7,489,011 B2 | 2/2009 | Yilmaz |
| 2005/0184291 A1 | 8/2005 | Cole et al. |
| 2005/0242411 A1 | 11/2005 | Tso |
| 2006/0115323 A1 | 6/2006 | Coppeta et al. |
| 2008/0036015 A1 | 2/2008 | Anderson et al. |

OTHER PUBLICATIONS

Chenming Hu; Optimum Doping Profile for Minimum Ohmic Resistance and High-Breakdown Voltage; IEEE Transaction on Electron Devices, vol. ED-26, No. 3, pp. 243-244; Mar. 1979.
Victor A.K. Temple et al.; A 600-Volt MOSFET Designed for Low On-Resistance; IEEE Transactions on Electron Devices, vol. ED-27, No. 2, pp. 343-349; Feb. 1980.
Xing-Bi Chen et al.; Optimum Doping Profile of Power MOSFET; IEEE Transactions on Electron Devices, vol. ED-29, No. 6; pp. 985-987; Jun. 1982.
P. Rossel; Power M.O.S. Devices; Microelectron, reliab., vol. 24, No. 2, pp. 339-366; 1984.
Int'l Search Report issued Mar. 25, 2008 in Int'l Application No. PCT/US07/75810.
International Preliminary Report on Patentability issued Feb. 17, 2009 in Int'l Application No. PCT/US2007/075810.
Office Action Issued Aug. 4, 2010 in U.S. Appl. No. 11/838,359.
Office Action issued Jun. 27, 2011 in U.S. Appl. No. 12/472,424.
Office Action issued Mar. 27, 2013 in TW Application No. 96129812.
Office Action issued Sep. 6, 2013 in U.S. Appl. No. 13/091,416.

SEMICONDUCTOR DEVICES WITH SEALED, UNLINED TRENCHES AND METHODS OF FORMING SAME

CROSS REFERENCE TO RELATED APPLICATIONS

This application is a continuation application of U.S. patent application Ser. No. 11/838,359, filed Aug. 14, 2007, entitled "Semiconductor Devices With Sealed, Unlined Trenches and Methods of Forming Same," currently pending, which claims the benefit of U.S. Provisional Patent Application No. 60/822,261, filed Aug. 14, 2006, entitled "Semiconductor Devices With Sealed, Unlined Trenches and Methods of Forming Same," and U.S. Provisional Patent Application No. 60/822,263, filed Aug. 14, 2006, entitled "Semiconductor Devices With Sealed, Unlined Trenches and Methods of Forming Same," the entire contents of all of which are incorporated by reference herein.

BACKGROUND OF THE INVENTION

In various semiconductor devices, it is often desirable, advantageous, and/or necessary to form one or more trenches in the substrate on which the device is being formed and/or in the various materials deposited on the substrate during the manufacture of the device. Such trenches may serve various purposes including, but not limited to, isolation of one region from another, or for example, in superjunction semiconductor devices such trenches can provide access to the drift region for doping.

Superjunction devices are an increasingly important type of semiconductor device that are designed for high voltage applications where decreased on-resistance is highly advantageous. Since the invention of superjunction devices by Dr. Xingbi Chen, as disclosed in U.S. Pat. No. 5,216,275, the contents of which are herein incorporated by reference, there have been many attempts to expand and improve on the superjunction effect of his invention. U.S. Pat. Nos. 6,410,958, 6,300,171 and 6,307,246 are examples of such efforts and are incorporated herein by reference.

In many semiconductor manufacturing processes, when a trench is desired, the trench recess is etched into the substrate. The trench is optionally surface treated to remove residues and/or roughened surfaces, and subsequently filled with a dense, high-quality insulating dielectric material. This process presents various problems in subsequent manufacturing and/or use. First, the dielectric material will often have thermal properties that are different from the surrounding substrate, which creates various forms of stress under normal operating temperatures and during subsequent high temperature fabrication steps. As one material expands differently than the other, defects can appear in the device. Second, in certain devices where trenches are relatively deep compared to their width, filling the trench can be difficult and can add cost and complication to the manufacturing process. Third, uncontrollable mobile ions often become incorporated in a filling material, resulting in potentially unstable high-voltage breakdown characteristics.

Prior attempts at solutions to the aforementioned problems have included the use of so-called empty trenches, wherein a trench is formed between two regions to be separated and subsequently lined with an oxide and simultaneously sealed at the upper opening of the trench, thereby forming an air filled buffer between the two regions. While such methods may alleviate the difficulties associated with completely filling deep trenches with a dielectric material, the lining of the trench in conjunction with the formation of the upper seal does not adequately alleviate the problems associated with divergent thermal properties between a substrate and trench lining materials.

Thus, there is a need in the art for semiconductor device structures with trenches suitable in various device designs that do not require filling and do not suffer from the aforementioned thermal complications.

BRIEF SUMMARY OF THE INVENTION

Embodiments of the present invention relate, in general, to semiconductor devices comprising unlined and sealed trenches and methods for forming the same, and more particularly, to superjunction semiconductor devices which include the unlined and sealed trenches described herein. The device embodiments of the present invention and method embodiments of the present invention are a significant improvement over various designs and methods of the prior art in that the process difficulties of filling trenches with a dielectric material are avoided and the potential difficulties that may result from employing materials with divergent thermal properties are avoided. Thus, methods in accordance with the embodiments of the present invention are less complicated, less costly, and are advantageous over the prior art.

One embodiment of the present invention includes a semiconductor device including a semiconductor material layer having a first region and a second region separated by an unlined trench disposed in the semiconductor material layer. The trench has sidewalls comprised of the semiconductor material and is sealed with a sealing material, such that the trench is air-tight.

Another embodiment of the present invention includes a semiconductor device having a substrate doped with a dopant of a first conductivity type. A layer of epitaxial silicon is disposed above the substrate and is also doped with a dopant of the first conductivity type.

The substrate is doped in an amount greater than the layer of epitaxial silicon. A trench disposed in the layer of epitaxial silicon has sidewalls comprised of the epitaxial silicon. The trench separates an active region and a termination region of the layer and is sealed by a sealing material such that the trench is air-tight. The active region may be a superjunction Schottky diode structure or a superjunction metal-oxide-semiconductor field-effect transistor (MOSFET) structure.

Yet another embodiment of the present invention includes a method that comprises providing a semiconductor device including a semiconductor material layer with a first region and a second region separated by an unlined trench disposed in the semiconductor material layer. The trench has sidewalls composed of the semiconductor material. The method further includes capping the trench with a sealing material such that the trench is air-tight.

A further embodiment of the present invention includes a method that comprises providing a semiconductor device composed from an epitaxial silicon layer doped with a dopant of a first conductivity type and disposed above a silicon substrate, which is doped with a dopant of a first conductivity type in an amount greater than the epitaxial silicon layer. The method also includes forming an unlined trench in the epitaxial silicon layer such that the trench separates a first region and a second region. The trench has side walls comprised of the epitaxial silicon. The method further includes forming an active region in one of the first and second regions, and a termination region in the other of the first and second regions. Formation of the active region comprises doping at least a first portion of the epitaxial silicon layer proximate to a sidewall of the trench with a dopant of the first conductivity type, doping at least a second portion of the epitaxial silicon layer proximate to the sidewall with a dopant of a second conductivity type, wherein the first portion extends laterally into the epitaxial silicon layer further than the second portion, and forming a superjunction Schottky diode or MOSFET structure at an upper surface of the active region. The method also includes applying a spun-on glass layer above the semiconductor device and over the trench, such that the trench is hermetically sealed by a portion of the spun-on glass layer.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1A:
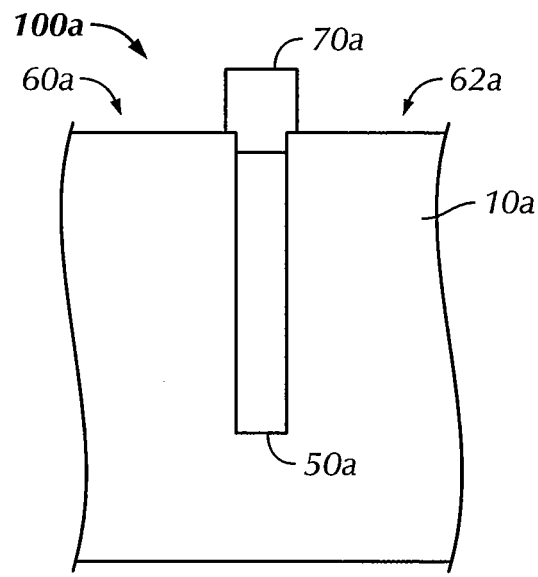
FIGS. 1A and 1B are cross-sectional schematic representations of portions of a semiconductor device in accordance with two embodiments of the present invention.

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. Embodiments of the present invention may be practiced in conjunction with various semiconductor fabrication techniques that are known in the art or to be developed.

Embodiments of the present invention include semiconductor devices with an unlined trench disposed in a layer of the device. As used herein, the term "unlined" refers to trenches that do not have additional material purposefully disposed on one or more surfaces of the trench. The sidewalls of the unlined trenches in accordance with embodiments of the present invention are comprised of the material of the layer in which the trenches are formed. The trenches have a depth that extends into the entire material layer in which the trenches are formed or any desired portion thereof. It is not required that the trenches extend completely through the material in which the trenches are disposed.

Semiconductor material layers suitable for use in the device embodiments of the present invention include, but are not limited to, various semiconducting materials such as silicon, germanium, arsenides, antimonides and/or phosphides of gallium and/or indium, and combinations thereof. In certain preferred embodiments, the semiconductor material layer is silicon, and more preferably epitaxial silicon. Epitaxial silicon refers to single crystal silicon grown over a substrate, usually via chemical vapor deposition (CVD). Epitaxially grown silicon deposited using CVD can be doped during formation with a high degree of control. Accordingly, lightly doped silicon may be deposited over a substrate. In certain preferred embodiments, a semiconductor material layer includes epitaxial silicon doped with a dopant of a first conductivity type at a level of about $7 \times 10^{13}$ cm$^{-3}$ to about $5 \times 10^{15}$ cm$^{-3}$. In certain more preferred embodiments, epitaxial silicon is doped with n-type conductivity, and in even more preferred embodiments, the epitaxial silicon is doped with n-type conductivity at a level of about $1 \times 10^{14}$ cm$^{-3}$ to about $2 \times 10^{14}$ cm$^{-3}$. Any suitable epitaxial deposition apparatus known or to be developed may be used to form an epitaxial semiconductor material layer suitable for use in embodiments of the present invention.

In various embodiments of the present invention, the semiconductor material layer is a silicon wafer. Silicon wafers can be prepared via standard techniques to prepare a suitable substrate. For example, suitable wafers may be prepared via a process wherein silicon is grown from a small crystal, called the seed crystal, rotated and slowly withdrawn from molten hyper-pure silicon to give a cylindrical crystal, which is then sliced to obtain thin disks. After slicing, the thin disks are finely ground, mirror-smooth polished, and cleaned. Suitable silicon wafers suitable for use as a semiconductor material layer may be undoped, or doped with either p-type or n-type conductivity, either heavily or lightly.

A semiconductor material layer may be disposed above a substrate. A suitable substrate, upon which a semiconductor material layer may be disposed, can include, for example, any of the various semiconducting materials described above as being suitable for use as the semiconductor material layer, a silicon wafer as described above, or combinations thereof. In various preferred embodiments of the present invention, a substrate may include a silicon wafer having a semiconductor material layer composed of epitaxial silicon disposed on the silicon wafer substrate.

In certain preferred embodiments of the present invention, the substrate and the semiconductor material layer are both doped with a dopant of the same conductivity type. Generally, in such preferred embodiments, the substrate is doped at a level greater than the semiconductor material layer. For example, in embodiments wherein the substrate is a silicon wafer doped with n-type conductivity and the semiconductor material layer includes lightly n-type doped epitaxial silicon, the level of doping in the substrate may be about $1\times10^{17}$ $cm^{-3}$ to about $1\times10^{20}$ $cm^{-3}$, and the level of doping in the semiconductor material layer can be about $7\times10^{13}$ $cm^{-3}$ to about $5\times10^{15}$ $cm^{-3}$.

Various embodiments of the present invention include semiconductor devices wherein at least one material is doped with a dopant of a first conductivity type or a second conductivity type. As used herein, conductivity type refers to either n-type conductivity or p-type conductivity. Thus, reference to a first conductivity type and a second conductivity type is intended to distinguish between the two, but does not necessarily imply that the first conductivity type must be one or the other. As will be understood by one of ordinary skill in the art, doping of a material can be carried out with dopants that result in a material having n-type conductivity or p-type conductivity. In other words, those skilled in the art will understand that in any given device, p-type conductivity regions can be substituted with n-type conductivity regions and vice versa, and the device would still be functionally correct. Therefore, where used herein, a reference to "n-type and p-type" can mean either "n-type and p-type" or "p-type and n-type". Accordingly, while many embodiments of the present invention described herein depict NPN junctions, embodiments of the present invention may also use NPN junctions.

Doping in accordance with various embodiments of the present invention may be carried out using any method or equipment known or to be developed for imparting impurities of either n-type or p-type into another material, including, for example, ion implantation and in-situ vapor deposition techniques.

Semiconductor device embodiments of the present invention include an unlined trench capped with a sealing material. Suitable sealing materials include, but are not limited to, silica and silicate-based compounds, organosilicon compounds, dopant-organic compounds, and photoresist-based compounds. Suitable silica and silicate compounds include materials having an $Si_xO_y$ formula, and in various preferred embodiments, include $SiO_2$. Suitable organosilicon compounds include, for example, siloxanes having hydrocarbon substituents bound to silicon atoms. Suitable dopant-organic compounds include, for example, polymeric boron-nitrogen compounds such as borazoles. In certain more preferred embodiments of the present invention, the sealing material is silica, e.g., $SiO_2$ (glass).

In one embodiment of the present invention, a sealing material includes spun-on glass. Spun-on glass refers to a silica, silicate, organosilicon compound or dopant-organic compound that is deposited via a spinning sol-gel technique. Any silica or silicate, organosilicon compound, or dopant-organic compound capable of being prepared as stable suspension of colloidal particles (i.e., a sol) and which can undergo a sol-gel transition can be applied via a spin-on method.

A suitable spin-on method that may be used in accordance with various embodiments of the present invention includes the application of a film or thin coating of a sol sealing material. The sol sealing material can be applied to a surface of an article placed on a spinning mechanism. The surface is preferably cleaned prior to application, and the sol sealing material is applied dropwise onto the center (i.e., spinning axis) of the surface. The article is rotated at a speed of about a few thousand rpm. The thickness of the resulting film is generally a function of the amount of material applied to the surface, the viscosity of the material and rotational speed of the spin.

Sealing materials suitable for use in accordance with embodiments of the present invention wherein spin-on application techniques are employed are generally applied in an amount and with a viscosity for a resulting film thickness of about 0.5 µm to about 5 µm. In certain preferred embodiments, the sealing material has a resulting film thickness of about 1 µm to about 2 µm. A sol sealing material may be applied to the surface in a dropwise manner at any suitable total volume based on the desired thickness of the film. Sol sealing materials may generally be applied in a dropwise manner to the surface at a viscosity based on the various application parameters and rotational speed.

As the sol sealing material contacts the surface, the centrifugal spinning force spreads the sol across the surface in a substantially even manner and the sol undergoes a transition to a gel. While not being bound to any particular theory of molecular interaction, it is believed that a combination of the centrifugal force, material viscosity, and/or surface tension permits the formation of a gel over the openings of the one or more trenches sealed in accordance with various embodiments of the present invention.

Suitable sealing materials may also be applied via deposition methods that provide a short mean free path for the materials to be deposited. A suitable deposition technique having a short mean free path can include, for example, silica deposition via atmospheric pressure chemical vapor deposition (APCVD). Another suitable deposition technique is plasma-enhanced chemical vapor deposition (PECVD).

In a preferred embodiment of the present invention, the sealing material is spun-on glass (e.g., $SiO_2$) applied in a dropwise manner at a total volume and a viscosity necessary to provide a film thickness of about 1 µm to about 2 µm.

Trenches in accordance with embodiments of the present invention are capped with a sealing material such that the trenches are sealed in an air-tight manner. The terms "air-tight" and "hermetic", as well as their derivatives, e.g., "hermetically", are used synonymously and interchangeably herein.

Sealed trenches in accordance with various embodiments of the present invention may contain one or more gases or may be sealed under a vacuum. In various embodiments, a sealed trench may contain one or more gases selected from inert gases and air. Preferred inert gases include nitrogen and argon. In a preferred embodiment, a sealed trench includes ambient air. In increasingly more preferred embodiments, a sealed trench comprises one or more gases having a moisture content below about 90%, below about 80%, below about 70%, below about 60%, below about 50%, below about 40%, below about 30%, below about 20%, below about 10%, and most preferably, below about 5%. In one preferred embodiment of the present invention, a trench includes ambient air having a maximum moisture content less than or equal to 1%.

The gas or gases contained within a sealed trench may be at standard atmospheric pressure or less. In certain preferred embodiments, the gas or gases have a pressure below standard atmospheric pressure.

In those embodiments of the present invention where a sealed trench contains another or dry air gas in place of or in addition to ambient air, the gas is generally provided to the trench via selected gases introduced into the processing chamber during manufacture. In those embodiments of the present invention wherein a sealed trench contains one or more gases under a reduced pressure, the reduced pressure is generally obtained by evacuating at least a portion of the gases present within the sealed chamber.

Semiconductor devices according to embodiments of the present invention include at least a first region and a second region separated by a sealed trench. In various embodiments, semiconductor devices include a plurality of regions wherein at least two regions are separated from each other by an unlined, sealed trench. In certain preferred embodiments, a semiconductor device includes a plurality of regions wherein each region is separated from each neighboring region by an unlined, sealed trench.

In one embodiment of the present invention, one of the first region and the second region is an active region and the other of the first region and the second region is a termination region. As used herein, an "active region" refers to an area in which semiconductor devices such as, for example, Schottky diodes, MOSFETS, or PINs are formed. In various embodiments where the semiconductor device includes a superjunction device, a termination region may refer to an area around an active region, which serves to gradually spread the electric field built up in the active region laterally between the periphery of the active region and the overall device periphery, reducing the lateral field sufficiently to prevent avalanche breakdown.

In various embodiments of the present invention wherein a semiconductor device comprises a plurality of regions, such devices may comprise one termination region and multiple active regions, one active region and multiple termination regions, or both multiple termination regions and multiple active regions.

Semiconductor devices in accordance with various embodiments of the present invention can include active regions which comprise a diode. In one embodiment, an active region comprises a plurality of mesas, each mesa defined by the semiconductor material layer between two neighboring trenches. In certain preferred embodiments of the present invention, each mesa comprises a diode formed at an upper surface of the mesa.

In various embodiments of the present invention, a diode may be a superjunction Schottky diode. In certain preferred embodiments, a semiconductor device includes an active region having a plurality of superjunction Schottky diodes. In one embodiment, a semiconductor device includes an active region having a plurality of mesas formed in the semiconductor material layer, wherein each mesa is separated from neighboring mesas by an unlined, sealed trench, and each mesa has a superjunction Schottky diode formed thereon.

Semiconductor devices in accordance with various embodiments of the present invention may contain active regions including a field-effect-transistor. In one embodiment, an active region includes a plurality of mesas, each mesa defined by the semiconductor material layer between two neighboring trenches. In certain preferred embodiments, each mesa may include a field effect transistor formed at an upper surface of the mesa. As used herein, formation of a device "at an upper surface" of the semiconductor material layer or a mesa formed therein, can refer to a device which is disposed on, partially within, or entirely within the material layer. Additionally, such devices "at an upper surface" of the semiconductor material layer or a mesa formed therein, can also be separated, partially or completely, from the material layer by one or more additional layers of materials such as, for example, oxides and anti-reflective coatings.

In various embodiments of the present invention, a field-effect transistor may be a superjunction MOSFET. In certain preferred embodiments, a semiconductor device includes an active region having a plurality of superjunction MOSFETs. In one embodiment, a semiconductor device includes an active region having a plurality of mesas formed in the semiconductor material layer, wherein each mesa is separated from neighboring mesas by an unlined, sealed trench and each mesa has a superjunction MOSFET formed thereon. Superjunction MOSFET structures in accordance with various embodiments of the present invention may include a gate insulating layer disposed between the semiconductor material layer and a gate. Suitable gate insulating layers include various dielectric materials capable of providing an insulating barrier between a semiconductor material and a gate. Examples of suitable gate insulating layer materials include, but are not limited to, oxides and nitrides such as silicon oxide and silicon nitride. Gates may include any conductive material such as, for example, a metal, metal silicide, polysilicon, or combinations thereof. Polysilicon materials suitable for use as gates include undoped polysilicon and n-doped or p-doped polysilicon.

In various embodiments of the present invention, a field-effect-transistor may be formed partially or entirely within the semiconductor material layer by providing a gate recess in an upper surface of the semiconductor material layer, forming a gate insulating layer on a surface of the gate recess, and forming a gate on or above the gate insulating layer. Source and drain regions are formed on opposite sides of the gate recess. In certain preferred embodiments wherein a field-effect-transistor is formed partially or entirely within the semiconductor material layer and the device comprises a vertical superjunction device, dual source regions may be formed on opposite sides of the gate recess and a drain contact may be provided at an opposing side of a drift region disposed below the source regions and gate recess.

In other embodiments of the present invention, a field-effect-transistor is formed partially above the semiconductor material layer by forming a gate insulating layer on an upper surface of the semiconductor material layer and forming a gate on or above the gate insulating layer. Source and drain regions are formed below the upper surface of the semiconductor material layer proximate to opposite sides of the gate. In certain preferred embodiments wherein a field-effect-transistor is formed partially above the semiconductor material layer and the device comprises a vertical superjunction device, dual source regions may be formed on opposite sides of the gate recess and a drain contact may be provided at an opposing side of a drift region disposed below the source regions and gate recess.

In various embodiments of the present invention, an active region may include field-effect-transistors of any two or more of the foregoing designs.

Any termination region design known or to be developed may be used in devices according to the embodiments of the present invention. A termination region where the active region comprises a superjunction device can include one or more spaced, concentric, diffusion rings, for example, p-type conductivity diffusion rings in an n-type epitaxial silicon material, spaced conductive ring-shaped field plates which surround the active region, or a combination of ring-shaped field plates and ring-shaped diffusion regions.

Superjunction devices of various embodiments of the present invention include a drift region with semiconductor materials disposed between the upper layer of the diode (e.g., a metal layer) or the upper layers of a device (e.g., field effect transistor) formed at an upper surface of the semiconducting material or upper surface of a mesa formed in the material, and the underlying substrate to which a drain contact may be provided. In certain embodiments wherein the device includes a superjunction device, the drift region of the superjunction device is disposed within the semiconductor material layer. In certain preferred embodiments, the drift region is disposed within an epitaxial silicon layer. A drift region in accordance with various embodiments of the present invention generally includes two or more regions of opposite conductivity arranged vertically beside one another. For example, in an active region including a mesa formed in a semiconductor material layer, a drift region disposed within the mesa may have two vertical adjacent regions of the mesa wherein one region is doped with p-type conductivity and the other region is doped with n-type conductivity. In certain embodiments, a drift region includes a plurality of regions with alternating conductivities. In certain embodiments, a drift region includes a portion of a semiconductor material layer having three adjacent regions, each region extending vertically from a depth position in the semiconductor material layer or the bottom of the layer to the upper surface of the layer or any depth position in the direction of the upper layer, wherein the outer regions are doped with a dopant of a first conductivity type and the inner region is doped with a dopant of a second conductivity type. Examples of suitable drift region designs are described in U.S. Pat. No. 5,216,275, the contents of which have been incorporated by reference herein. Any superjunction drift region pattern of alternating conductivity type regions known or to be developed may be employed in devices according to various embodiments of the present invention.

In certain preferred embodiments of the present invention, wherein a semiconductor device includes an epitaxial silicon layer doped with a dopant of a first conductivity type, and wherein an active region (which is separated from another region by a sealed, unlined trench formed in the epitaxial silicon layer) includes a superjunction device, a drift region disposed in the active region may include a first portion of the epitaxial silicon layer proximate to a sidewall of the trench, which is doped with a dopant of the first conductivity type, and a second portion of the epitaxial silicon layer proximate to the sidewall which is doped with a dopant of a second conductivity type. The first portion extends laterally into the epitaxial silicon layer further than the second portion. The first portion may extend laterally into the layer to a greater extent than the second portion, for example, by carrying out a diffusion process to drive the dopant further into the material. Each portion can extend vertically within the epitaxial layer from any depth position in the layer or the bottom of the layer to another depth position in the layer or the upper surface thereof.

In certain preferred embodiments of the present invention, wherein a semiconductor device includes an epitaxial silicon layer doped with a dopant of a first conductivity type, and wherein an active region (which is separated from neighboring regions by a sealed, unlined trench formed in the epitaxial silicon layer on two sides of the active region) includes a superjunction device, a drift region disposed in the active region may have three vertical portions of the epitaxial silicon layer. A first portion is proximate to a sidewall of the trench on one side of the active region and is doped with a dopant of a second conductivity type. A second portion of the epitaxial silicon layer is proximate to the sidewall of the trench on another side of the active region and is doped with a dopant of the second conductivity type. A third portion of the epitaxial silicon layer is disposed between the first portion and the second portion and is doped with a dopant of the first conductivity type. Each portion may extend vertically within the epitaxial layer from any depth position in the layer or the bottom of the layer to another depth position in the layer or the upper surface thereof.

In various embodiments of the present invention, a semiconductor device may include one or more additional layers above the semiconductor material layer. For example, a metal layer, an insulating layer, an anti-reflective layer, a patterning/masking layer, a protective layer (e.g., a protective nitride), or a layer comprised of any other material used in semiconductor manufacturing may be disposed over any portion of the semiconductor material layer of a device according to the invention. In certain embodiments wherein the semiconductor device comprises a Schottky diode, a metal layer is disposed on the semiconductor material in any manner suitable for creating the appropriate interface between the metal and semiconductor.

In some embodiments of the present invention, an additional layer disposed above the semiconductor material layer is applied before a trench is formed in the device. In such embodiments, a trench may extend through the additional material layer and into, or through, the semiconductor material layer. In such embodiments, a sealing material may be disposed over the two separated portions of the additional layer to cap and hermetically seal the trench formed below. In such embodiments, the sealing material may be disposed over and between the two separated portions of the additional layer to cap and hermetically seal the trench formed below, entirely between the two separated portions of the additional layer, between the two separated portions of the additional layer and partially within the opening of the trench, or entirely within the trench.

In some embodiments of the present invention, an additional layer disposed above the semiconductor material layer is applied after a trench is formed in the device. In such embodiments, a sealing material may be disposed above the opening of the trench, over and partially within the trench, or entirely within the trench.

Figure 1B:
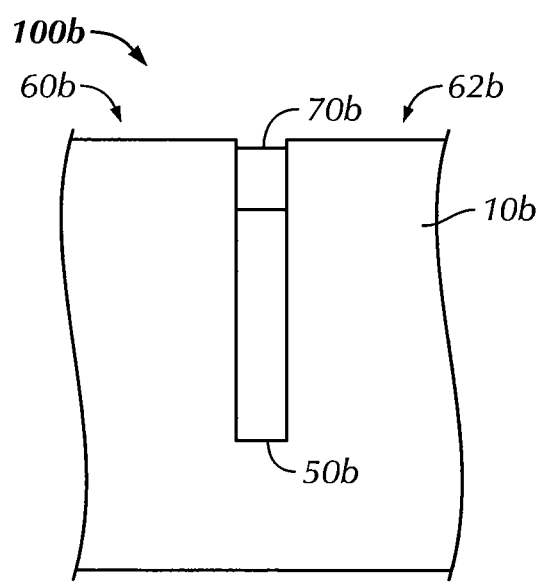

Referring to FIG. 1A, one embodiment of the present invention includes a semiconductor device 100*a* having a semiconductor material layer 10*a* in which unlined trench 50*a* is disposed. Unlined trench 50*a* separates a first region 60*a* from a second region 62*a*. The unlined trench 50*a* is sealed in an airtight manner with sealing material 70*a*, a portion of which extends out of the trench 50*a*. Referring to FIG. 1B, another embodiment of the present invention includes a semiconductor device 100b having a semiconductor material layer 10b in which unlined trench 50b is disposed. Unlined trench 50b separates a first region 60b from a second region 62b. The unlined trench 50b is sealed in an airtight manner by sealing material 70b, which is disposed entirely within the trench. As described above, the sealing material 70a, 70b may be disposed entirely above the trench (not shown), entirely within the trench 50b, or both partially above and partially within the trench 50a.

Figure 2A:
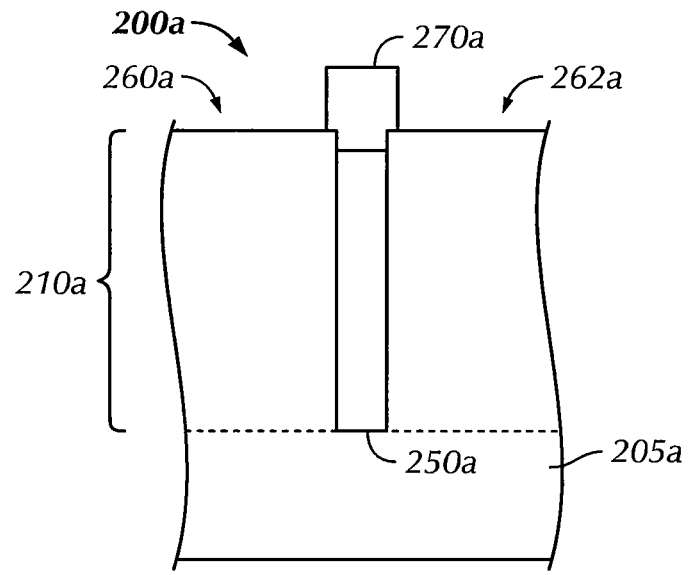
FIGS. 2A and 2B are cross-sectional schematic representations of portions of semiconductor devices in accordance with two embodiments of the present invention.

Referring to FIG. 2A, a semiconductor device 200a includes a semiconductor material layer 210a disposed above substrate 205a, with the semiconductor material layer 210a being separated into a first region 260a and a second region 262a by unlined trench 250a. In the embodiment depicted in FIG. 2A, the trench 250a extends all the way through the semiconductor material layer 210a to the substrate 205a. The unlined trench 250a is capped in an airtight manner by sealing material 270a, which is disposed both partially above and partially within the trench 250a.

Figure 2B:
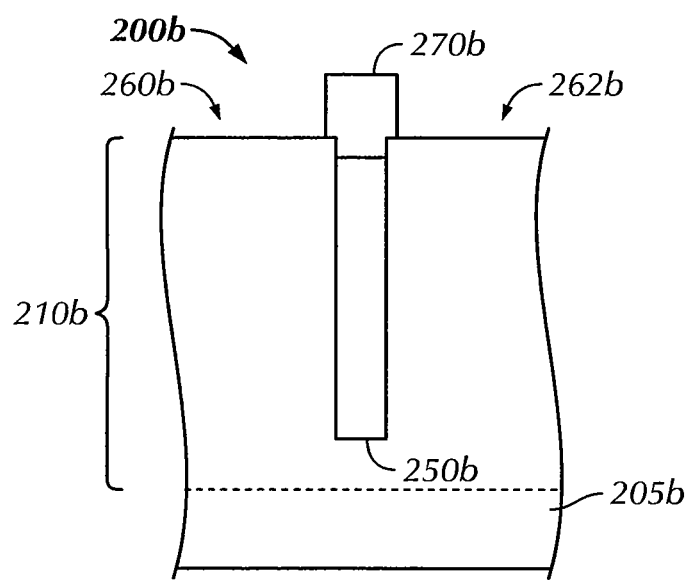

Referring to FIG. 2B, a semiconductor device 200b includes a semiconductor material layer 210b separated into a first region 260b and a second region 262b by trench 250b. In the embodiment depicted in FIG. 2B, the unlined trench 250b extends to a predetermined depth within the semiconductor material layer 210b, but does not extend all the way to the underlying substrate 205b. The trench 250b is capped in an airtight manner with sealing material 270b.

Figure 3:
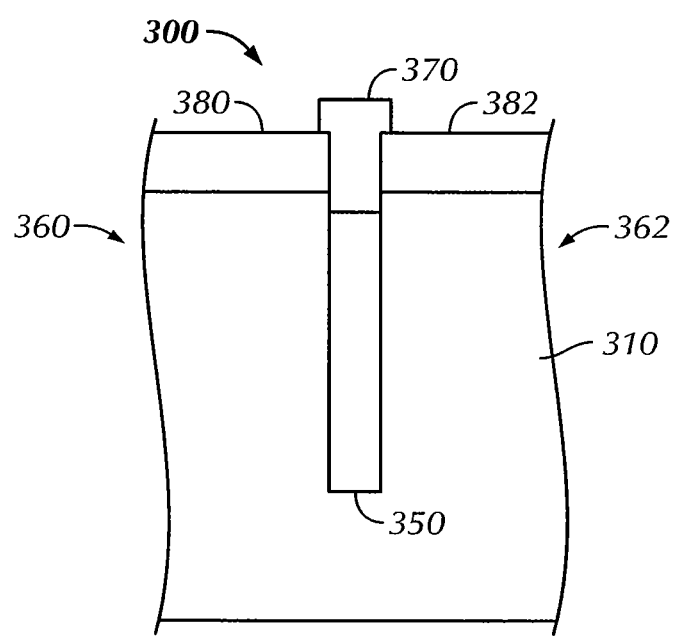
FIG. 3 is a cross-sectional schematic representation of a semiconductor device in accordance with one embodiment of the present invention.

Referring to FIG. 3, a semiconductor device 300 includes a semiconductor material layer 310 separated into a first region 360 and a second region 362 by unlined trench 350. The embodiment depicted in FIG. 3 includes an optional additional layer 380 disposed above the first region 360 and an optional additional layer 382 disposed above the second region 362. Optional layers 380, 382 may be various materials as described above for use as one or more additional layers, such as, for example, a metal or an insulator. The trench 350 is sealed in an airtight manner by sealing material 370, which is disposed over the trench 350, between the optional layers 380, 382 and partially within the trench 350.

Figure 8A:
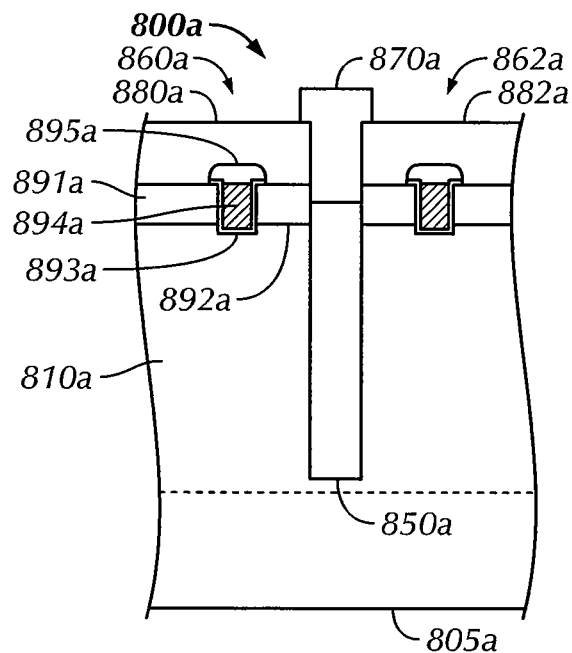
FIGS. 8A and 8B are cross-sectional schematic representations of portions of semiconductor devices containing field effect transistors in accordance with two embodiments of the present invention.

Referring now to FIG. 8A, each of the first region 860a and the second region 862a in the semiconductor device 800a includes a field effect transistor structure. The semiconductor material layer 810a is separated into first region 860a and second region 862a by trench 850a, which extends to a depth position within semiconductor material layer 810a. As in other embodiments of the present invention, the trench 850a may alternatively extend through the entire depth of the semiconductor material layer 810a, and optionally at least partially into an underlying substrate 805a. Semiconductor material layer 810a is disposed above substrate 805a. Each of first region 860a and second region 862a includes a field effect transistor. Thus, as shown in FIG. 8A, a field effect transistor in first region 860a includes regions 891a and 892a, which may be buried diffusion implant regions doped with the same or different conductivity type, gate oxide layer 893a, and gate material 894a. In the embodiment depicted in FIG. 8A, an optional gate insulating layer 895a is disposed over the gate 894a. Suitable gate insulating layer materials include any insulating material, such as, for example, borophosphorosilicate glass (BPSG). Additionally, in the embodiment depicted in FIG. 8A, optional additional layer 880a is disposed above the first region 860a and optional additional layer 882a is disposed above the second region 862a. The trench 850a is sealed in an airtight manner with sealing material 870a, which is disposed over the trench 850a, between optional additional layers 880a, 882a, and partially within the trench 850a.

Figure 8B:
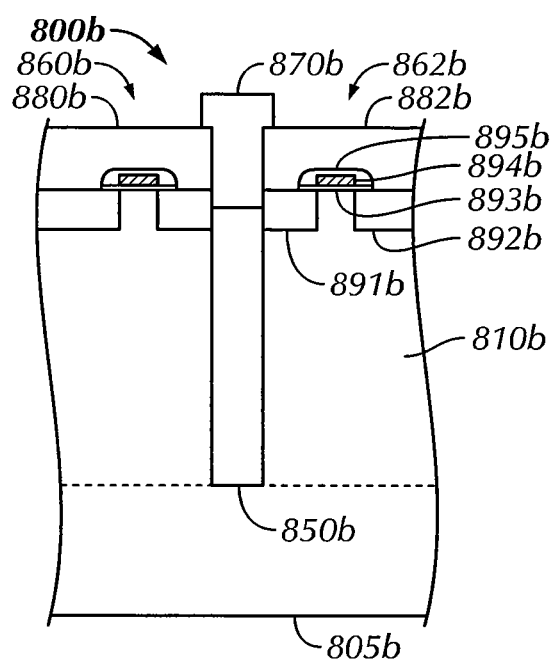

Referring to FIG. 8B, each of the first region 860b and second region 862b of semiconductor device 800b includes a field effect transistor structure. The semiconductor material layer 810b is separated into first region 860b and second region 862b by trench 850b, which extends to a depth position through the entire semiconductor material layer 810b to the substrate 805b. As in other embodiments of the present invention, the trench 850b may extend only partially through the semiconductor material layer 810b, or optionally through the entire layer, and optionally at least partially into the underlying substrate 805b. Semiconductor material layer 810b is disposed above substrate 805b. Each of first region 860b and second region 862b includes a field effect transistor. For example, as shown in FIG. 8B, a field effect transistor in the second region 862b includes regions 891b and 892b, which may be buried diffusion implant regions doped with the same or different conductivity type, gate oxide layer 893b, and gate material 894b. In the embodiment depicted in FIG. 8B, an optional gate insulating layer 895b is disposed over the gate 894b. Additionally, in the embodiment depicted in FIG. 8B, optional additional layer 880b is disposed above the first region 860b and optional additional layer 882b is disposed above the second region 862b. The trench 850b is sealed in an airtight manner with sealing material 870b, which is disposed over the trench 850b, between optional additional layers 880b and 882b, and partially within the trench 850b.

Embodiments of the present invention also include methods of forming semiconductor devices in accordance with the various embodiments of the invention as described above. Methods in accordance with various embodiments of the invention include providing a semiconductor device composed of a semiconductor material layer having a first region and a second region separated by an unlined trench disposed in the semiconductor material layer.

The trench has sidewalls composed of the semiconductor material. The semiconductor material layer may be provided as described above, such as, for example, as an epitaxially grown layer disposed above a substrate. A trench may be formed by removing a portion of the semiconductor material layer. As described above, any method of removing such material, known or to be developed, such as, for example, wet or dry etching may be used to form a trench.

Methods in accordance with various embodiments of the invention further include capping or sealing the trench with a sealing material such that the trench is air-tight. Suitable sealing materials and methods of application are described above. In accordance with various embodiments, a sealing material may be applied over the semiconductor device as a film or thin coating, and areas of the film or thin coating that are not over a trench may be removed. For example, after application of a sealing material coating, patterning and removal of the material may be carried out to leave sealing material over a trench. In other embodiments, a sealing material can be applied over the semiconductor device and at least partially within a trench, and all portions of the sealing material disposed outside the trench may be removed, for example, via blanket etching. In various preferred embodiments, the sealing material includes spun-on glass.

In various method embodiments of the present invention, additional layers may be disposed on or within various portions of the semiconductor devices. For example, as discussed above, additional layers, such as metals, dielectric insulating layers, anti-reflective coating, protection layers and the like may be formed. Any suitable means of forming such layers, known or to be developed may be used. For example, a metal layer may be formed by sputtering and vapor deposition techniques. The deposition of various dielectric insulating layers, such as, e.g., oxides, may include thermal oxidation and vapor deposition techniques. Nitrides may be deposited, for example, via nitridation and vapor deposition techniques.

In various embodiments of the present invention, methods may include forming an active region in one of the first and second regions. In certain embodiments, an active region includes a superjunction device. As described above, suitable superjunction devices may include a drift region of alternatively doped vertical regions disposed within a mesa, at an upper surface of which a superjunction device, e.g., a Schottky diode or MOSFET, is disposed.

Formation of a drift region may be accomplished in any way known or to be developed in the art of superjunction devices. In various embodiments of the present invention, a drift region may be formed by angled doping of a sidewall of a trench with a dopant of a first conductivity type, followed by a drive-in treatment, followed by a second doping of the sidewall with a dopant of a second conductivity type. A drive-in treatment may include heat-activated diffusion of the dopant.

In certain preferred embodiments, angled doping is accomplished via angled ion implantation. The width of a trench and the depth of the trench can advantageously be used to determine an implantation angle $\Phi$, $\Phi'$ (i.e., a first or second angle of implant $\Phi$, $\Phi'$) for ion implantation. In embodiments where a semiconductor device includes an active region having a plurality of mesas separated by a plurality of trenches and the active region is separated from a termination region by a trench, the width of all trenches is preferably approximately the same distance to facilitate angled ion implantation.

For example, at a slight angle $\Phi$ (i.e., a first angle of implant $\Phi$), optionally without benefit of a masking step, mesas may be implanted with a dopant of a first conductivity type along one sidewall of a trench at a high energy level in the range of about 40 Kilo-electron-volts (KeV) to several Mega-eV (MeV). Preferably, the energy level is in the range of about 200 KeV to 1 MeV, but it should be recognized that the energy level should be selected to sufficiently implant the dopant. The first angle of implant $\Phi$, as represented by thick arrows (e.g., see FIG. 4B), is determined by the width and depth of the trenches and can be about 2° to about 12° from vertical and is, for example, preferably about 4° where a trench has a width of about 3 μm and a depth of about 40 μm. Determining the first predetermined angle of implant $\Phi'$ based on the width and depth of the trenches helps to ensure that the entirety of the sidewalls of the trenches are implanted. Opposite sides of a given mesa can be implanted similarly using a second angle of implant $\Phi'$ having the opposite value of the first angle of implant $\Phi$. For example, where the first angle of implant $\Phi$ is 4°, the second angle of implant $\Phi'$ is −4°. In various embodiments of the present invention, an optional dielectric layer may be disposed above the semiconductor material layer. In embodiments wherein angled ion implantation is carried out, the dielectric layer may cover the upper surfaces of one or more of the mesas to provide protection from unintended implantation at the upper surfaces.

Drive-in of a dopant can be performed by applying heat at a temperature of up to about 1200° Celsius for up to about 24 hours. It should be recognized that the temperature and time may be selected and altered to control drive in of the dopant.

After doping with a dopant of the first conductivity type and optional drive-in, doping with a dopant of a second conductivity type may be carried out using angled ion implantation. The second dopant implant is performed at the first predetermined angle of implant $\Phi$ and at an energy level of about 30 KeV to 1 MeV. Preferably, the energy level is in the range of about 40 to 300 KeV, but it should be recognized that the energy level should be selected to sufficiently implant the dopant. Opposite sides of the mesas are implanted as described above, as well. Drive-in of the dopant of the second conductivity type may also be carried out.

Figure 4A:
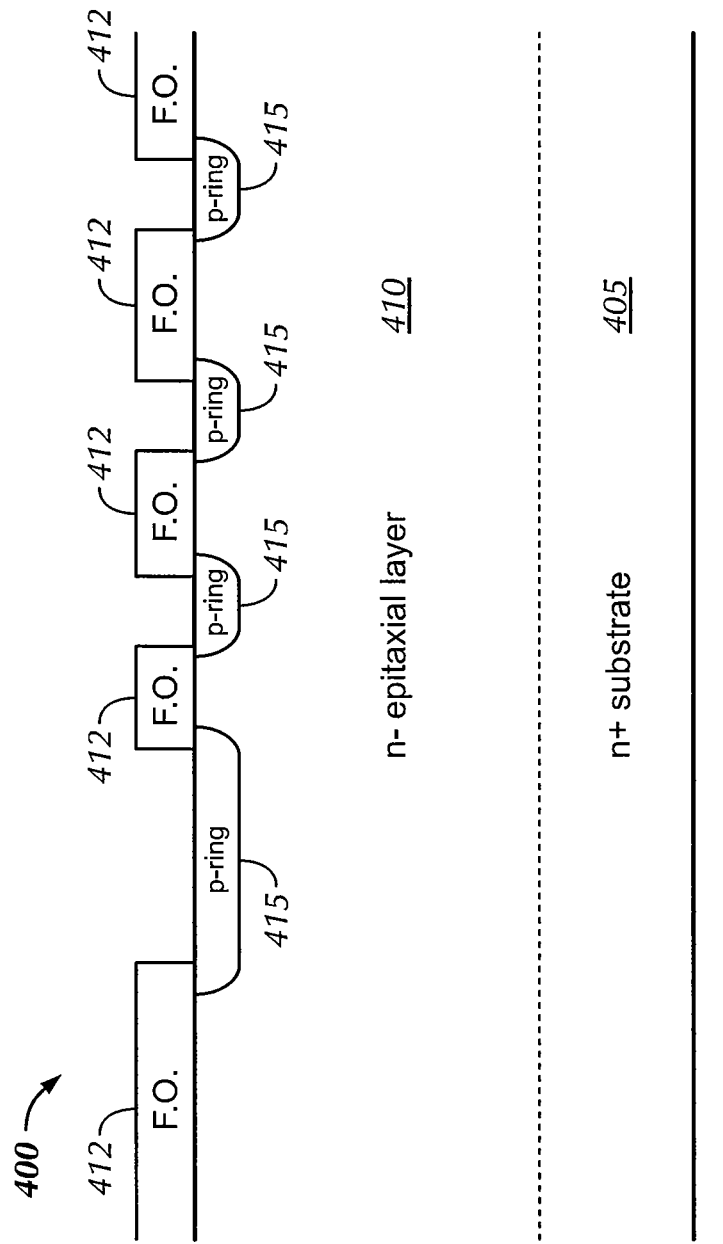
FIGS. 4A-4E are cross-sectional schematic representations of a portion of a semiconductor superjunction Schottky diode device at various stages of production during a method in accordance with another embodiment of the present invention.

Certain preferred embodiments of methods according to the present invention are described in more detail, but without limiting the invention, with reference to FIGS. 4A through 4E. Referring to FIG. 4A, a semiconductor device 400 is provided having an epitaxial silicon layer 410, which can be doped with a dopant of a first conductivity type, e.g., n-type conductivity, disposed above a substrate 405, which can be doped with n-type conductivity in an amount greater than the epitaxial silicon layer 410. A field oxide ("F.O.") layer 412 is disposed above the epitaxial silicon layer 410. Such dielectric layers, for example, the field oxide layer 412, may be deposited via chemical vapor deposition or grown thermally, with a resulting layer thickness of about 0.5 μm to about 2 μm, preferably about 1 μm. The field oxide layer 412 can be patterned with any suitable patterning layer (not shown) and etched to expose selected areas of the epitaxial silicon layer 410. Buried diffusion poring implants (p-rings) 415 are then formed between the oxide layer 412 via boron implantation or in any other suitable manner.

Figure 4B:
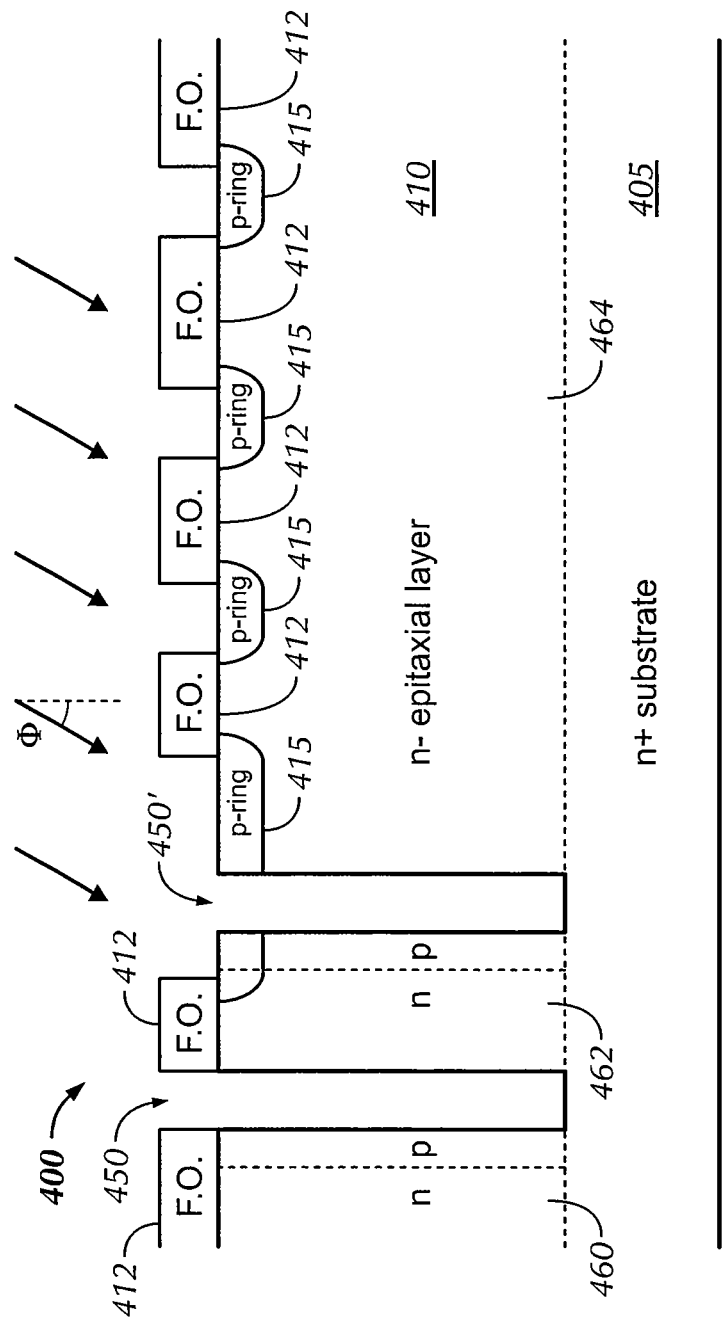

Referring to FIG. 4B, unlined trenches 450, 450' are formed in the semiconductor device separating first region 460, second region 462, and third region 464. The trenches 450, 450' extend completely through the epitaxial layer 410 to the substrate 405. A photoresist patterning layer (not shown) may be disposed above the field oxide layer 412 to provide a pattern for etching the trenches 450, 450'. The etching may be carried out via a two-step wet etching method wherein the oxide layer 412 is first removed and then the epitaxial silicon material 410 is removed. After an optional sacrificial oxide process, which can help to remove defects on the trench sidewall caused by etching, the semiconductor device 400 is subjected to angled ion implantation at a first angle of implantation (~+4°) indicated by the arrows shown in FIG. 4B. The implantation is carried out with a phosphorus (n-type) dopant to provide a heavily doped region of n-type conductivity at the sidewalls of the trenches 450, 450'.

The semiconductor device 400, in which an unprotected sidewall of each of first region 460 and second region 462 has been implanted with an impurity of n-type conductivity, is then subjected to angled ion implantation with a dopant of a second conductivity type, p-type conductivity in the embodiment shown, at the first angle of implantation. The implantation is carried out with a Boron (p-type) dopant. Prior to the second implantation, the photoresist layer (not shown) used to pattern the trenches is removed and a drive-in step is carried out on the first angled implant. After the second implantation, another drive-in step is carried out.

Figure 4C:
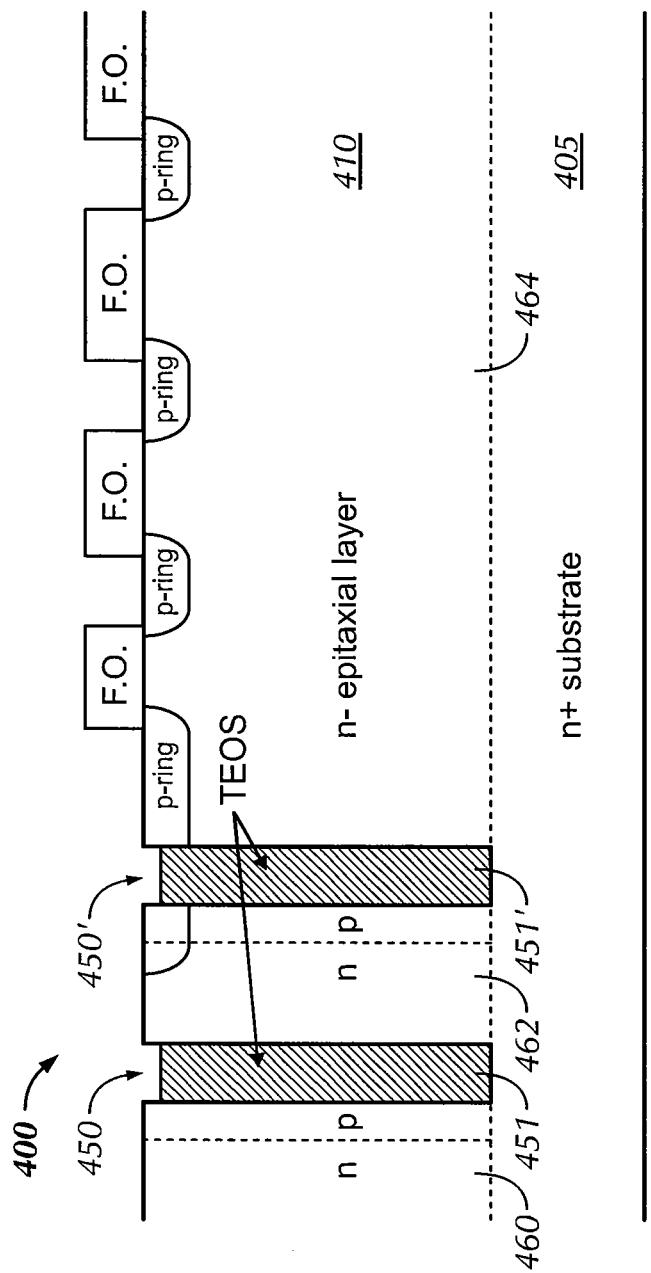

Referring to FIG. 4C, the semiconductor device 400, wherein an unprotected sidewall of region 460 and of region 462 have been implanted with an additional impurity of a second conductivity type, is subjected to a temporary trench refill process. A temporary fill material 451, 451', such as, for example, tetraethylorthosilicate (TEOS), is deposited over the semiconductor device 400 and within unlined trenches 450, 450' and a removal process is carried out, such as for example, chemical mechanical polishing (CMP), to remove the temporary fill material 451, 451' disposed outside the trenches 450, 450'. Temporary refill materials are preferably inexpensive and easy to deposit, but do not necessarily have to be sturdy, dense, good insulators or have any particular thermal properties since no temperature greater than 450° C. will be applied while the temporary refill material 451, 451' is present in the trenches 450, 450'. Hence no stress or defects associated therewith will be generated in the semiconductor device 400.

Referring to FIG. 4C, a patterning and removal procedure is carried out on the semiconductor device 400 such that the field oxide layer 412 is removed above first region 460 and second region 462. Patterning can be carried out by depositing an active mask (not shown) of, for example, a photoresist material or a hard masking material in any desired pattern. Removal can be carried out with any suitable etching procedure for removing the field oxide material 412.

Figure 4D:
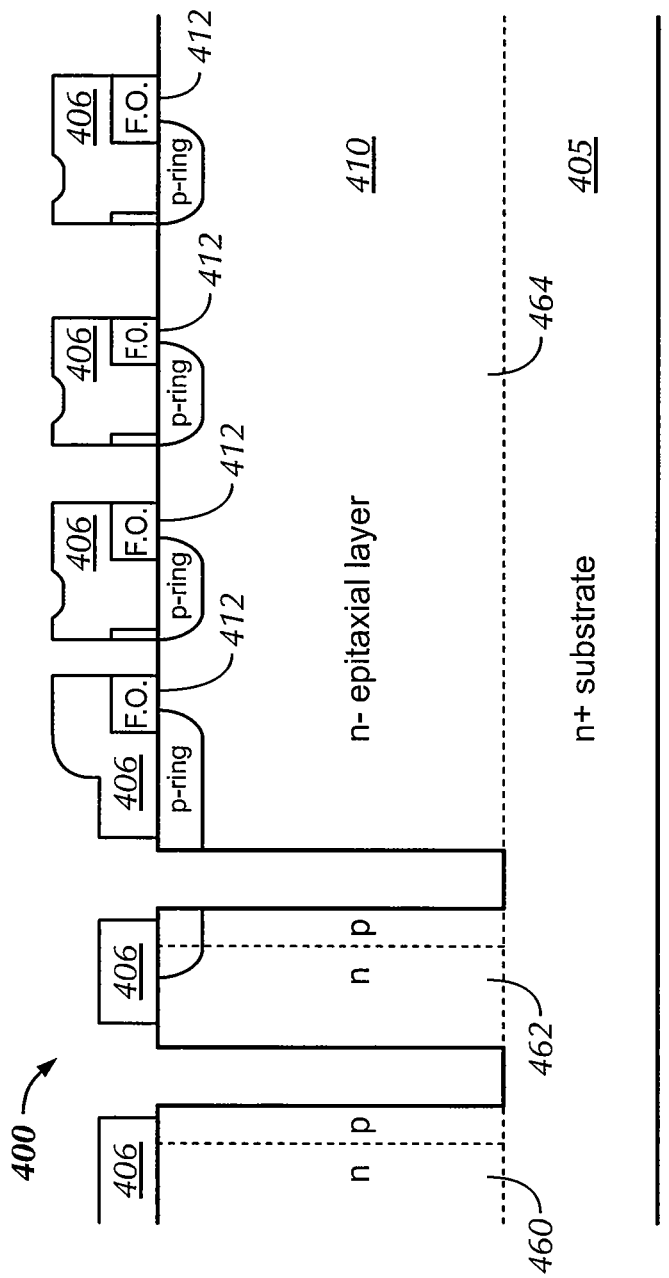

In FIG. 4D, a metal layer 406 is deposited above the semiconductor device and subjected to removal of portions of the metal layer 406 and the temporary trench refill material 451, 451'. The process includes the deposition of a patterning layer (not shown), e.g., a photoresist patterning material, above the metal layer 406 and subsequent etching of the metal 406 and the temporary trench fill material 451, 451' using the same patterning layer. After removal of the temporary fill material 451, 451', the patterning layer may be removed.

Figure 4E:
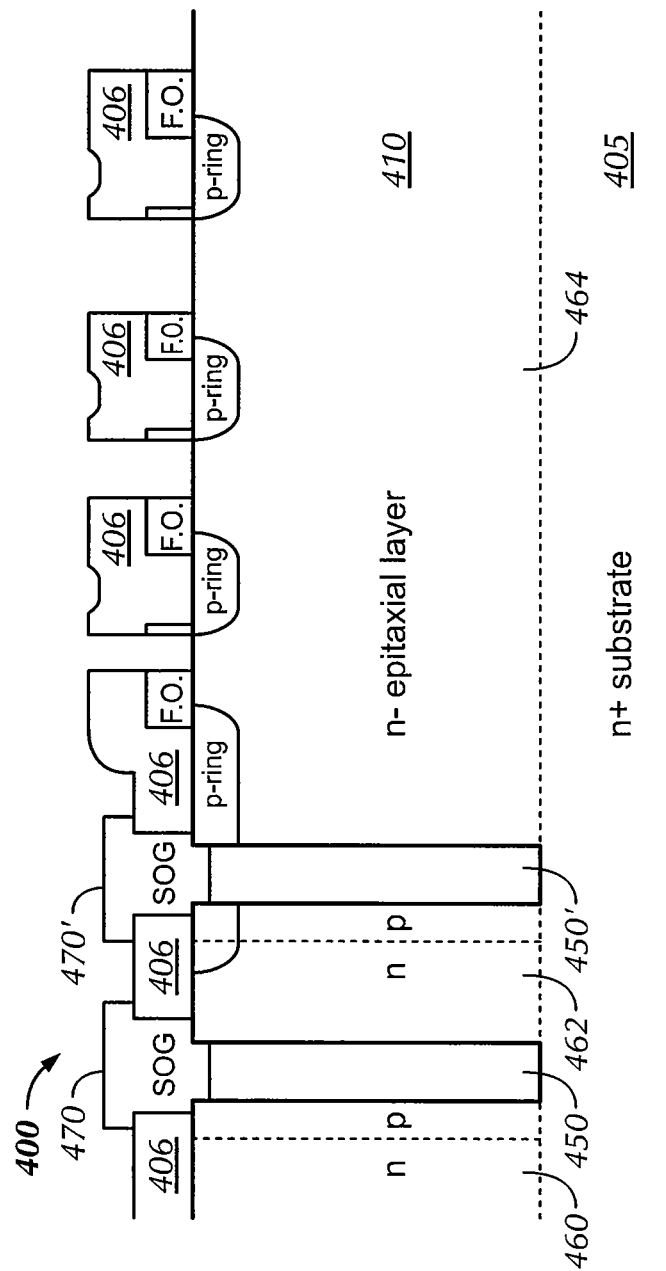

In FIG. 4E, the unfilled and unlined trenches 450, 450' are hermetically sealed with a sealing material 470, 470', such as for example, spun on glass, via the deposition of a spun on glass layer above the semiconductor device 400, subsequent patterning of the spun on glass layer, and removal of the spun on glass material such that the remaining spun on glass is disposed above the unlined trenches 450, 450'. As depicted in FIG. 4E, the spun-on glass sealing material 470, 470' may be disposed between the metal 406 remaining above the mesas 460, 462 and partially within the trenches 450, 450'.

Figure 5A:
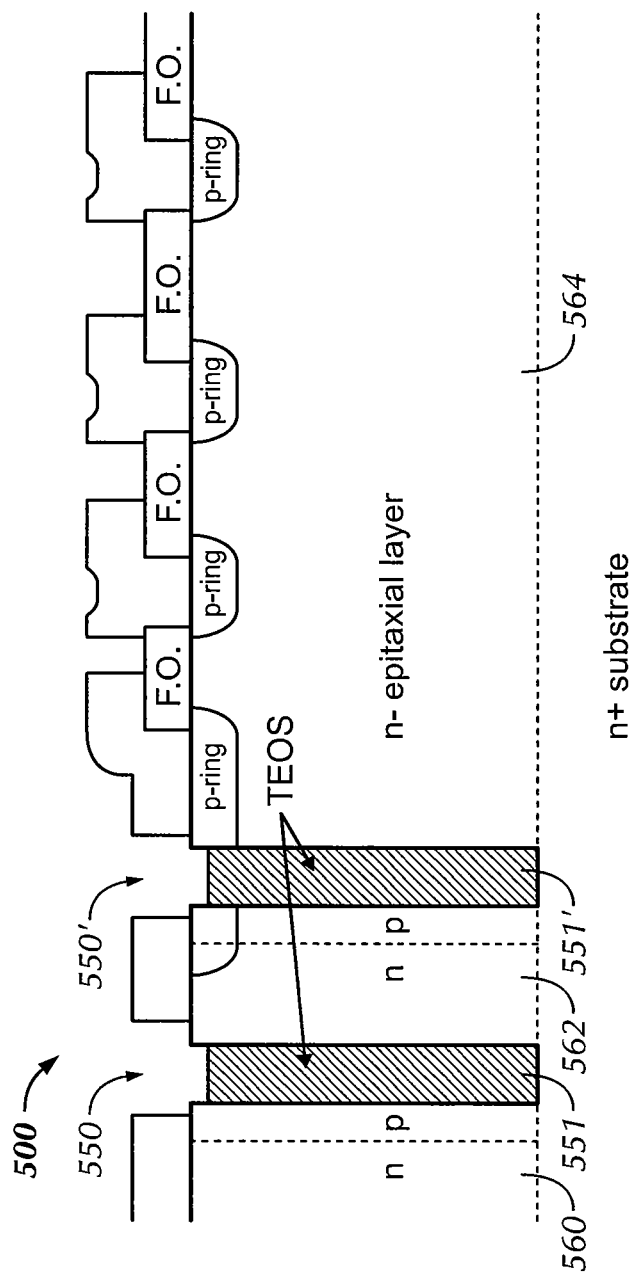
FIGS. 5A-5D are cross-sectional schematic representations of a portion of a semiconductor superjunction Schottky diode device at various stages of production during a method in accordance with another embodiment of the present invention.

An additional preferred embodiment of the present invention is described in more detail, but without limiting the invention, with reference to FIGS. 5A through 5D. Referring to FIG. 5A, a semiconductor device 500 is provided having unlined trenches 550, 550' separating first region 560, second region 562, and third region 564. The trenches are filled with a temporary fill material 551, 551', such as, for example, TEOS.

Figure 5B:
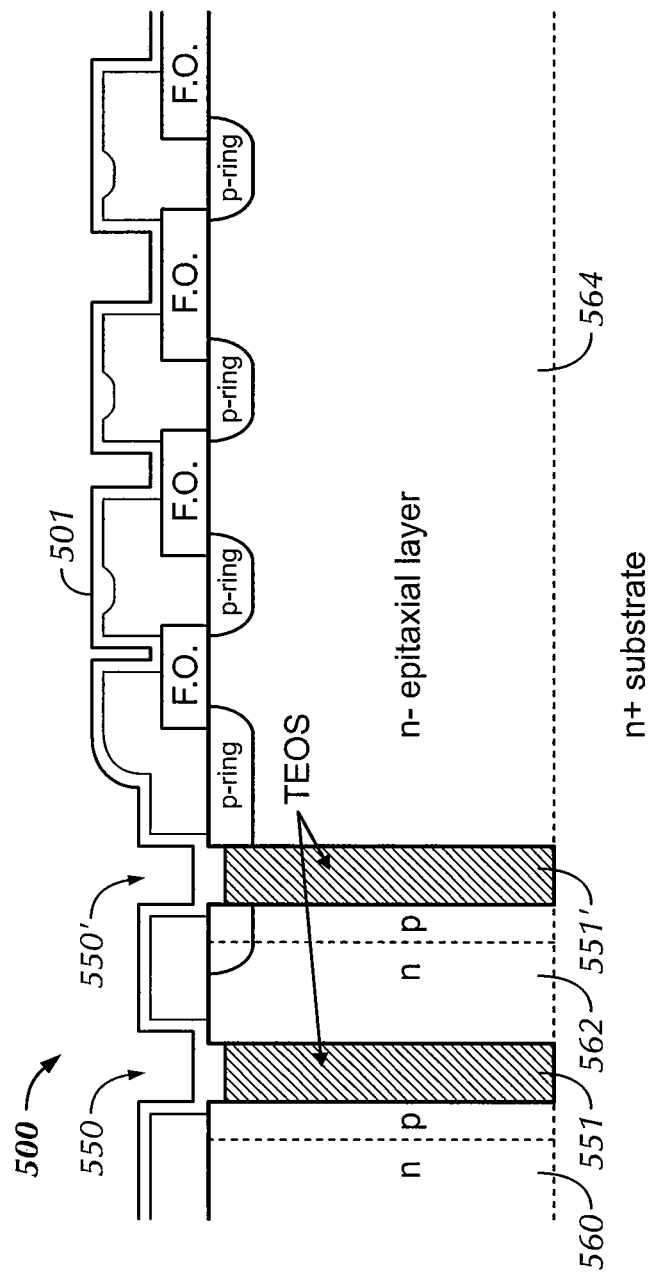
Figure 5C:
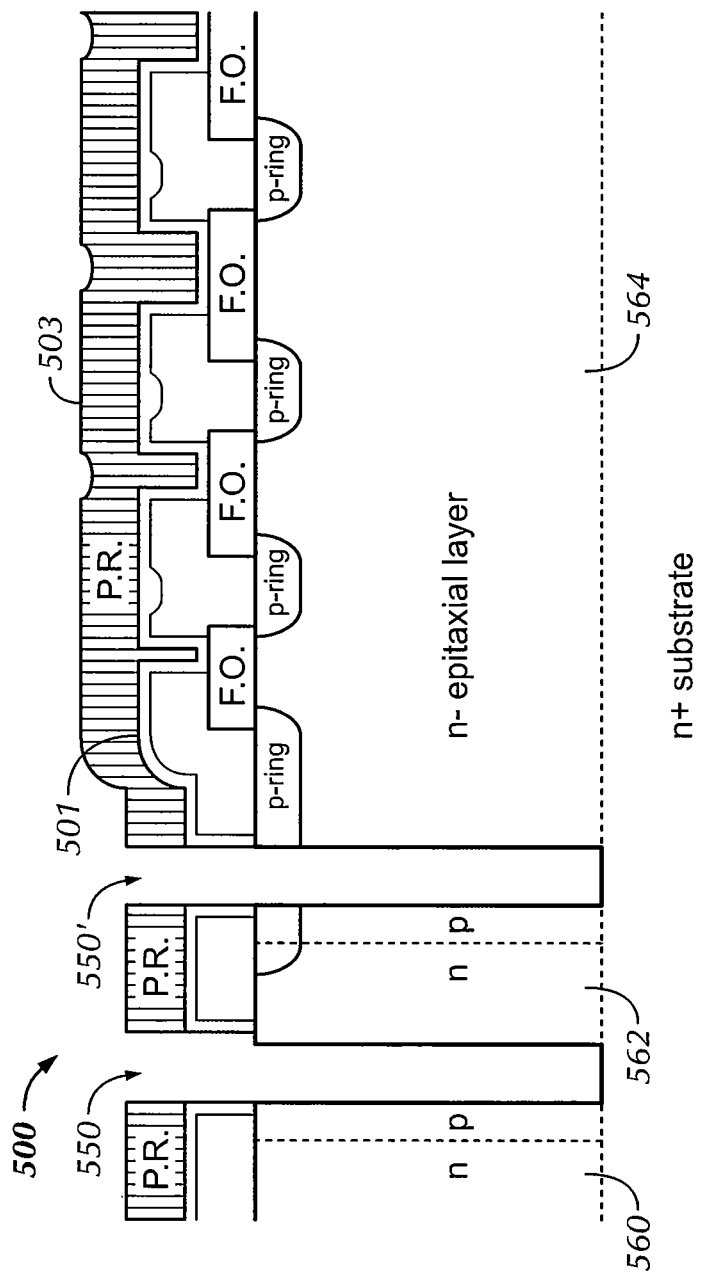

In FIG. 5B, the first, second, and third regions 560, 562, and 564 as well as the temporarily filled trenches 550, 550' are covered by a protective layer 501. In the embodiment depicted in FIG. 5B, the protective layer 501 comprises silicon nitride. Referring to FIG. 5C, a removal procedure is carried out on the semiconductor device 500. The removal procedure includes the deposition of a patterning layer 503, e.g., a photoresist patterning material, above the protective layer 501 and subsequent etching and removal of the temporary trench fill material 551, 551'.

Figure 5D:
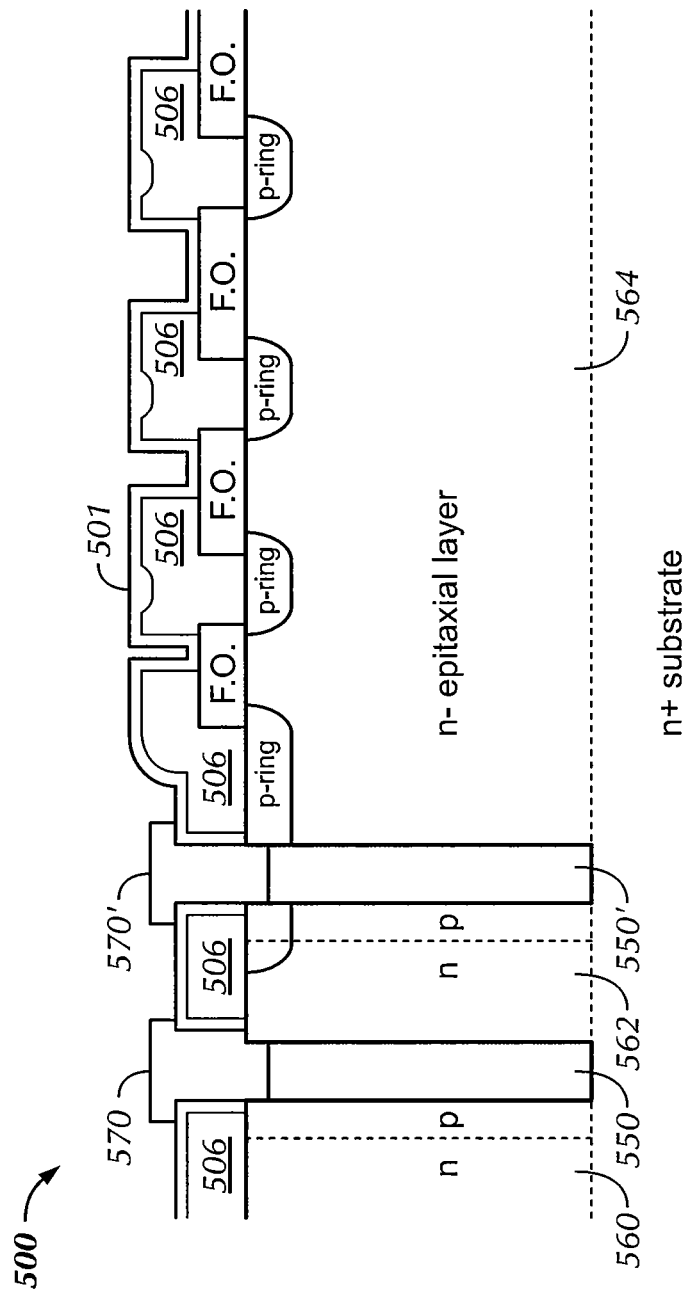

After the removal of the temporary fill material 551, 551', the patterning layer 503 may be removed. In FIG. 5D, the unfilled and unlined trenches 550, 550' are hermetically sealed with a sealing material 570, 570', such as, spun on glass, via the deposition of a spun on glass layer above the semiconductor 500, subsequent patterning of the spun on glass layer, and removal of the spun on glass material such that the remaining spun on glass 570, 570' is disposed only above the unlined trenches 550, 550'. As depicted in FIG. 5D, the spun on glass sealing material 570, 570' may be disposed between the metal 506 and protective layer 501 remaining above the mesas 560, 562, 564 and partially within the trenches 550, 550'.

Figure 6A:
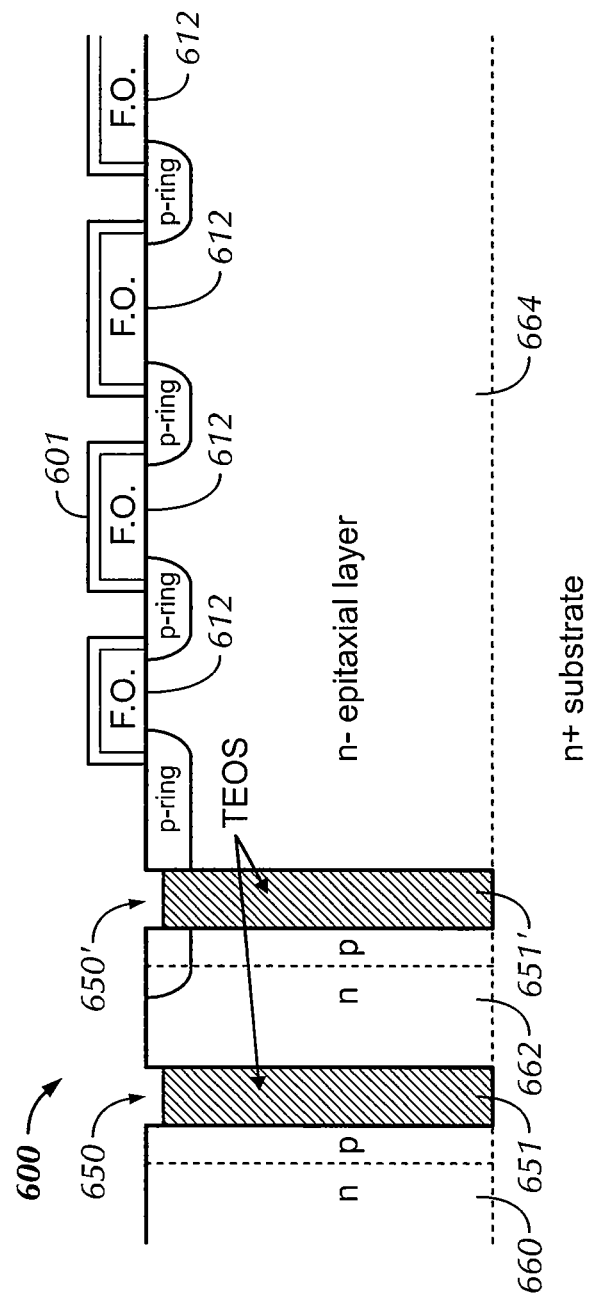
FIGS. 6A-6C are cross-sectional schematic representations of a portion of a semiconductor superjunction Schottky diode device at various stages of production during a method in accordance with another embodiment of the present invention.

An additional preferred embodiment of the present invention is described in more detail with reference to FIGS. 6A through 6C. Referring to FIG. 6A, a semiconductor device 600 is provided having unlined trenches 650, 650' separating first region 660, second region 662, and third region 664. The trenches 650, 650' are filled with a temporary fill material 651, 651', such as, for example, TEOS. The third region 664 is partially covered by field oxide regions 612, which in turn are covered by a protective layer 601. In the embodiment depicted in FIG. 6A, the protective layer 601 comprises silicon nitride.

Figure 6B:
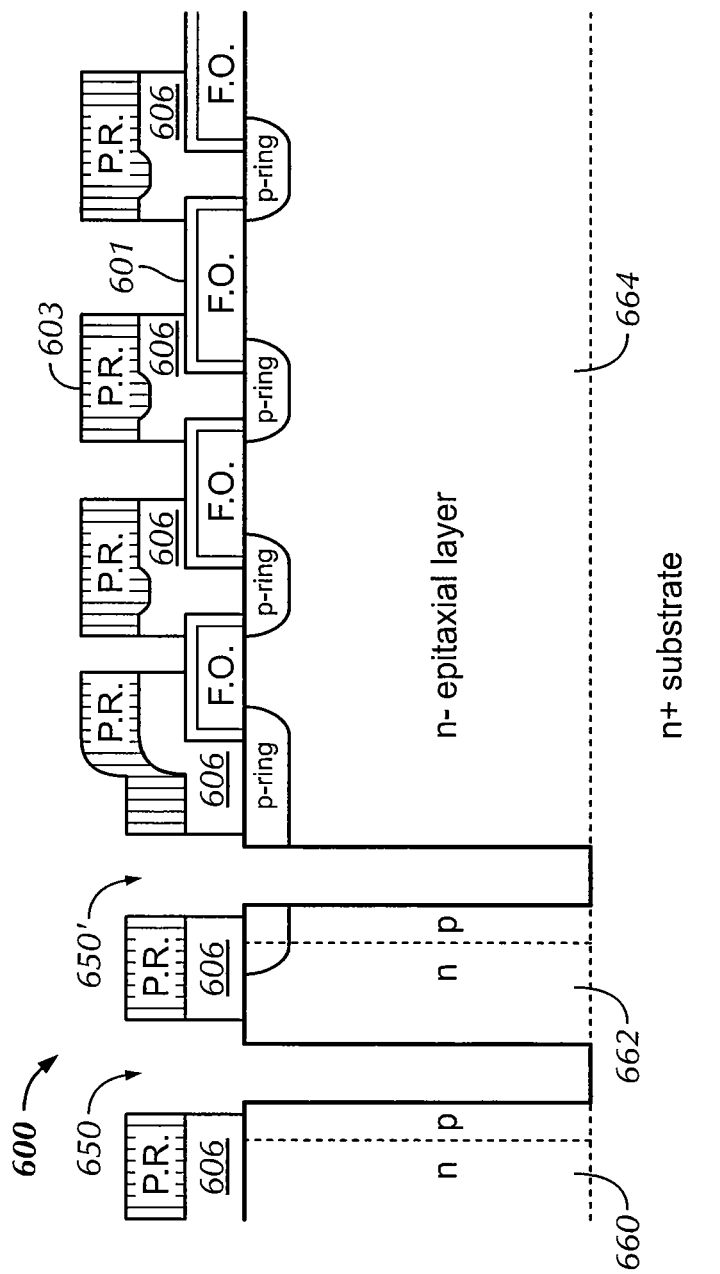

In FIG. 6B, a metal layer 606 is deposited above the semiconductor device 600 and subjected to removal of portions of the metal layer 606 and the temporary trench refill material 651, 651'. The process includes the deposition of a patterning layer 603, e.g., a photoresist patterning material, above the protective layer 601 and subsequent etching of the metal 606 and the temporary trench fill material 651, 651'. After removal of the temporary fill material 651, 651', the patterning layer 603 may be removed.

Figure 6C:
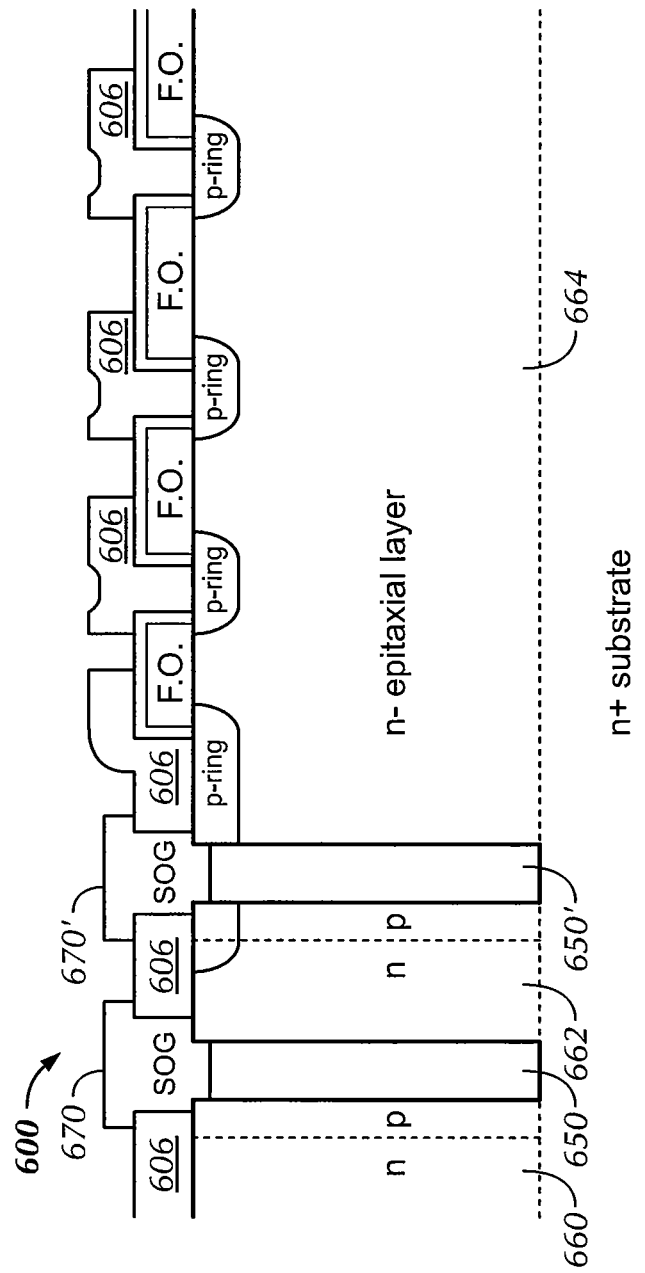

Referring to FIG. 6C, the air filled and unlined trenches 650, 650' are hermetically sealed with a sealing material 670, 670', such as, for example, spun on glass, via the deposition of a spun on glass layer above the semiconductor 600, subsequent patterning of the spun on glass layer and removal of the spun on glass material such that the remaining spun on glass is disposed above the unlined trenches 650, 650'. As depicted in 6C, the spun on glass sealing material 670, 670' may be disposed between the metal 606 remaining above the mesas and partially within the trenches 650, 650'.

Figure 7A:
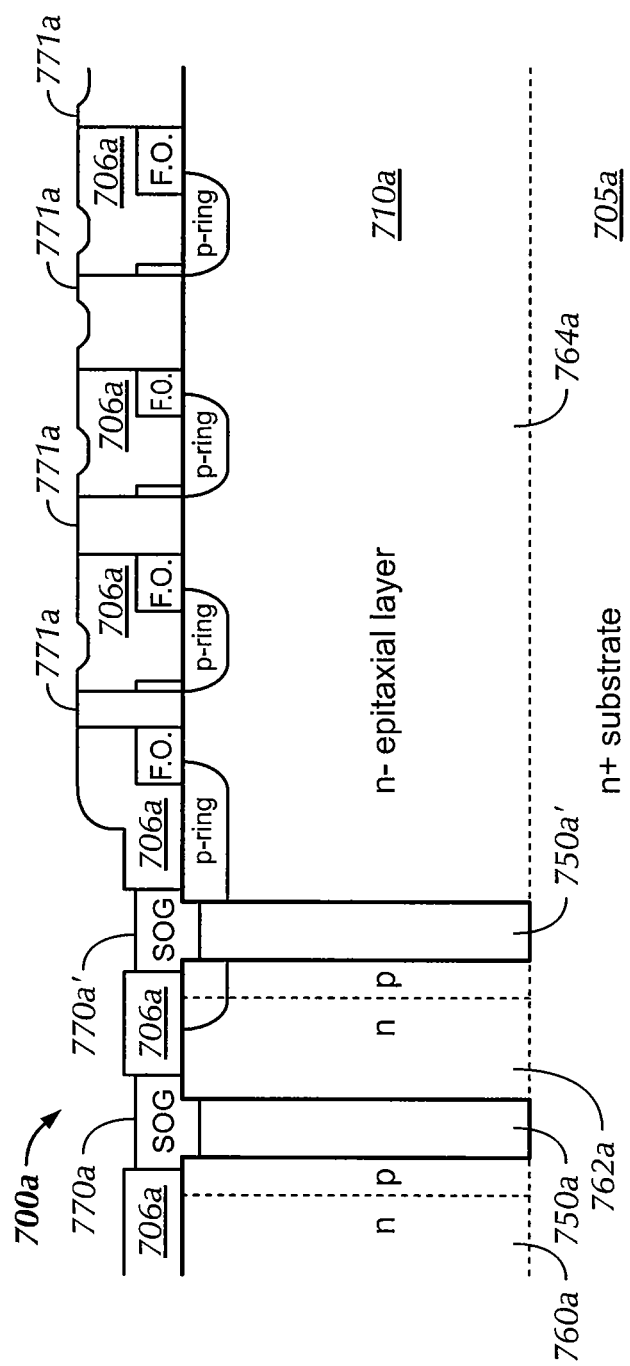
FIGS. 7A-7F are partial cross-sectional schematic representations of superjunction Schottky diode devices prepared in accordance with four different embodiments of the present invention.

Additional preferred embodiments of the present invention are described in more detail, but without limiting the invention, with reference to FIGS. 7A through 7F. In FIG. 7A, an embodiment of the present invention is depicted wherein the semiconductor device 700a comprises a first region 760a, a second region 762a, and a third region 764a, disposed above a substrate 705a. The first region 760a comprises a superjunction Schottky diode. Second region 762a comprises a superjunction Schottky diode and third region 764a comprises a termination region. First region 760a and second region 762a are separated from the third region 764a by unlined trench 750a', which is sealed in an airtight manner with spun on glass sealing material 770a'. First region 760a and second region 762a are separated from one another by unlined trench 750a, which is sealed in an airtight manner with spun on glass sealing material 770a. In the embodiment depicted in FIG. 7a, the spun-on glass sealing material 770a, 770a' is disposed entirely between portions of the metal 706a deposited above the mesas of regions 760a, 762a. Spun-on-glass sealing material 771a is disposed entirely between portions of the metal 706a deposited above region 764a. Suitable formation of sealing materials 770a, 770a', and the sealing material 771a disposed entirely between portions of the metal 706a can be carried out by depositing a coating of the sealing material above the device 700a and carrying out a blanket etching process over the entire surface. In such embodiments, one less masking step is used.

Figure 7B:
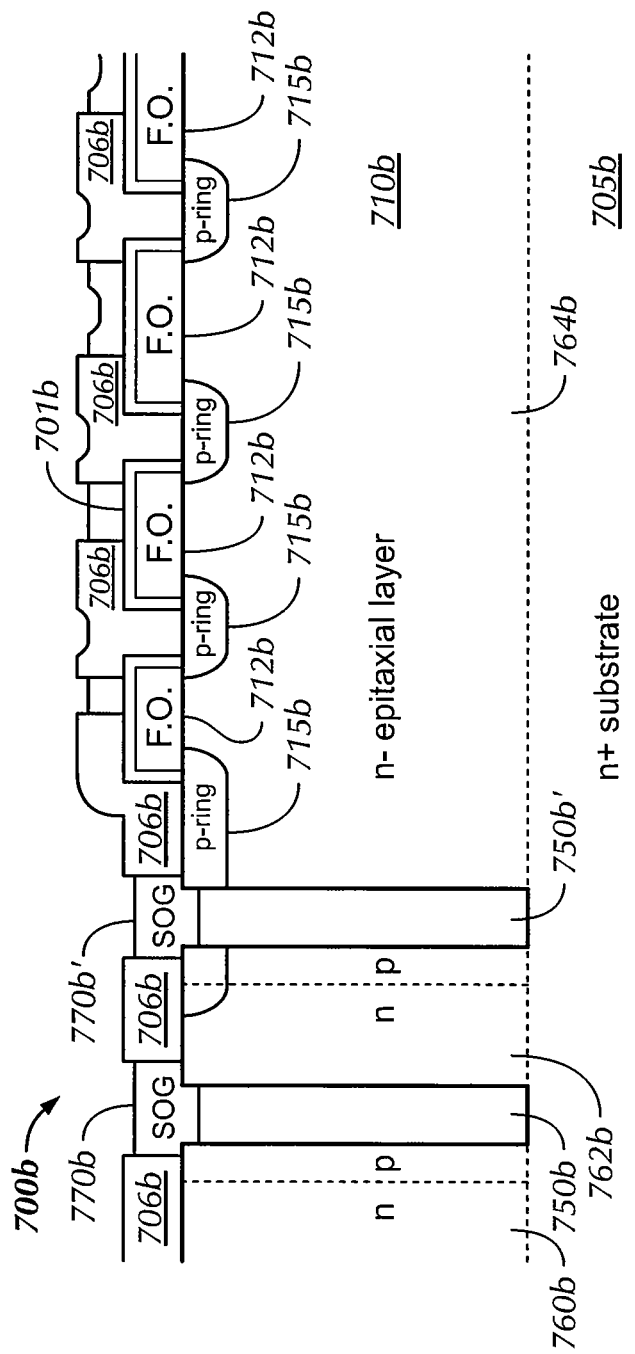

In FIG. 7B, another embodiment of the present invention is depicted wherein the semiconductor device 700b includes a first region 760b, a second region 762b, and a third region 764b disposed above a substrate 705b. First region 760b comprises a superjunction Schottky diode, second region 762b also comprises a superjunction Schottky diode, and third region 764 comprises a termination region. First region 760b and second region 762b are separated from third region 764b by unlined trench 750b', which is sealed in an airtight manner with spun on glass sealing material 770b'. First region 760b is separated from second region 762b by unlined trench 750b, which is sealed in an airtight manner with spun on glass sealing material 770b. The third region 764, which comprises a termination region of the semiconductor device 700b, is provided with a plurality of implantation regions 715b disposed in the epitaxial silicon layer 710b, which are partially covered by field oxide regions 712b, which are covered by a protective layer 701b. In the embodiment depicted in FIG. 7B, the protective layer 701b comprises silicon nitride. Sealing materials 770b, 770b' are disposed between the metal portions 706b and partially within the trenches 750b, 750b'.

Figure 7C:
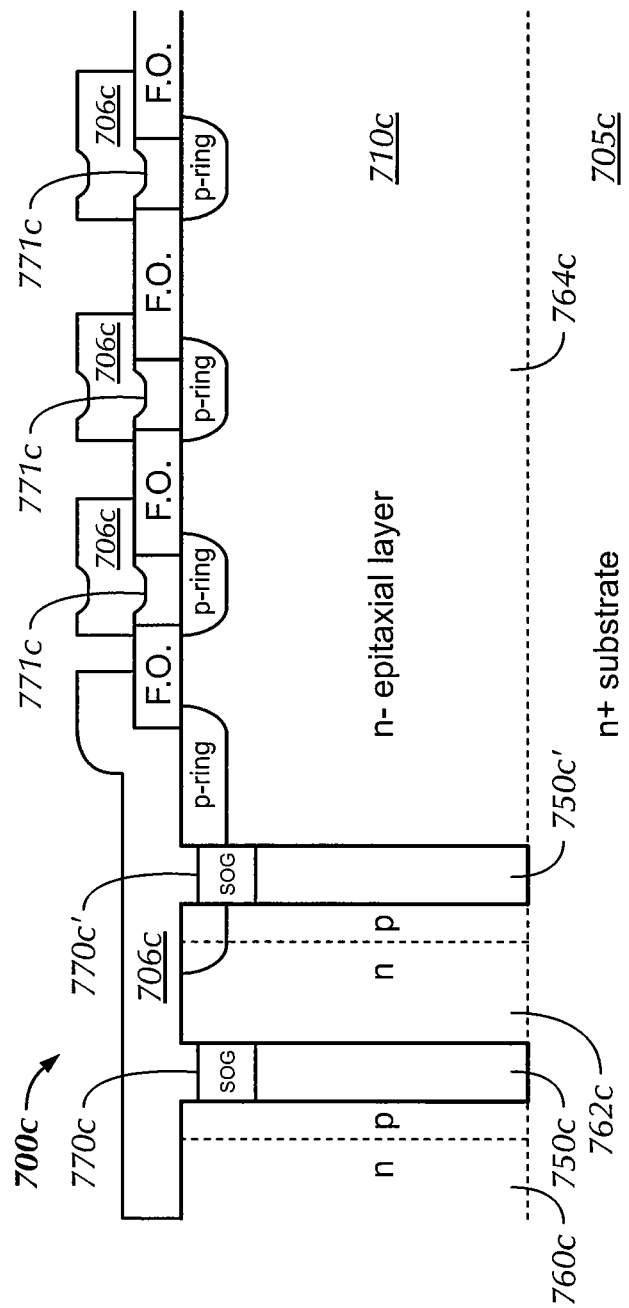

In FIG. 7C, an embodiment of the present invention is depicted wherein the semiconductor device 700c includes a first region 760c, a second region 762c, and a third region 764c, disposed above a substrate 705c. The first region 760c comprises a superjunction Schottky diode. Second region 762c also comprises a superjunction Schottky diode and third region 764c comprises a termination region. First region 760c and second region 762c are separated from the third region 764c by unlined trench 750e, which is sealed in an airtight manner with spun on glass sealing material 770c'. First region 760c and second region 762c are separated from one another by unlined trench 750c. Following the second implantation drive-in step, the trench 750c is sealed in an airtight manner with spun on glass sealing material 770c. Blanket etching is used to remove sealing material 751c, 751 c' outside of the trenches 750c, 750c', followed by deposition of the metal 706c. In the embodiment depicted in FIG. 7C, the spun-on glass sealing material 770c, 770c', is disposed entirely beneath portions of the metal 706c deposited above the mesas of the regions 760c, 762c. Similarly, the spun-on-glass sealing material 771c is disposed entirely beneath portions of the metal 706c deposited over the region 764c.

Figure 7D:
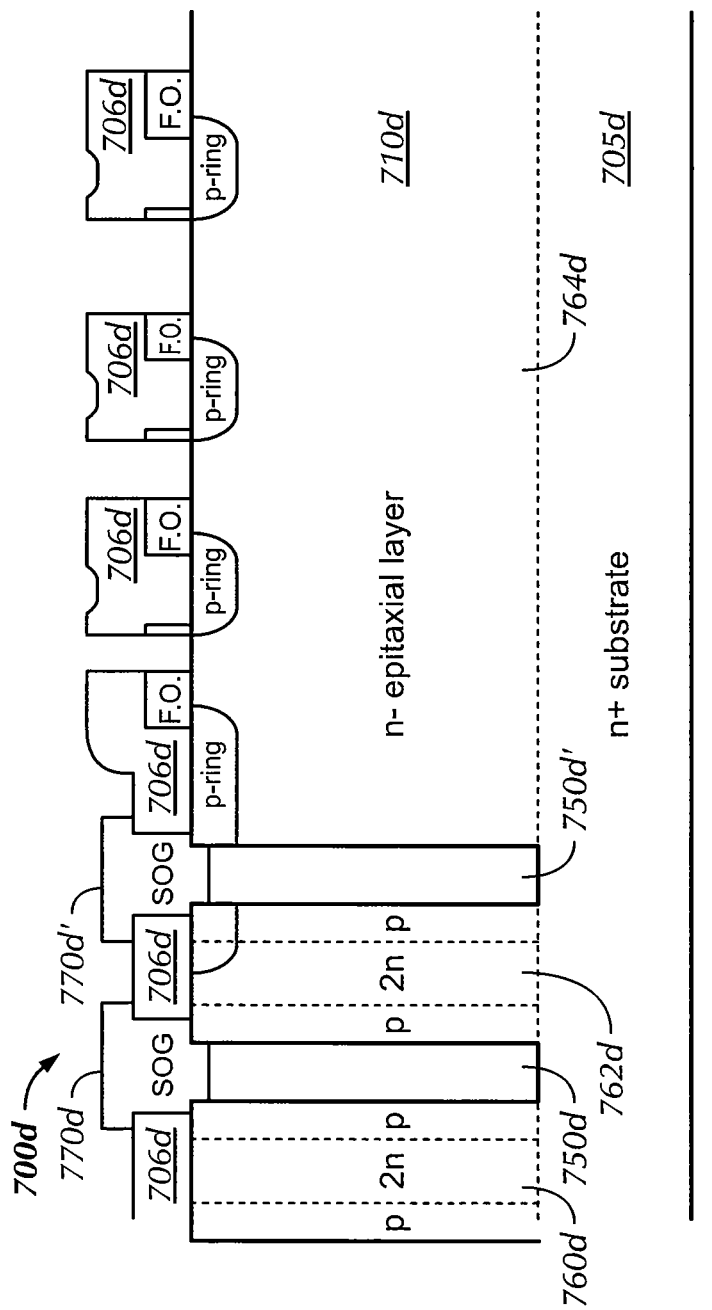

In FIG. 7D, still another embodiment of the present invention is depicted wherein the semiconductor device 700d comprises a first region 760d, a second region 762d, and a third region 764d. First region 760d and second region 762d each comprise a superjunction Schottky diode wherein each drift region 760d, 762d comprised of epitaxial silicon layer 710d has two sidewall implants. In the embodiment depicted in FIG. 7D, the unlined trenches 750d, 750d' are sealed in an airtight manner with spun on glass sealing material 770d, 770d' respectively. Spun on glass sealing materials 770d, 770d' are disposed above and between the metal portions 706d and partially within the trenches 750d, 750d'.

Figure 7E:
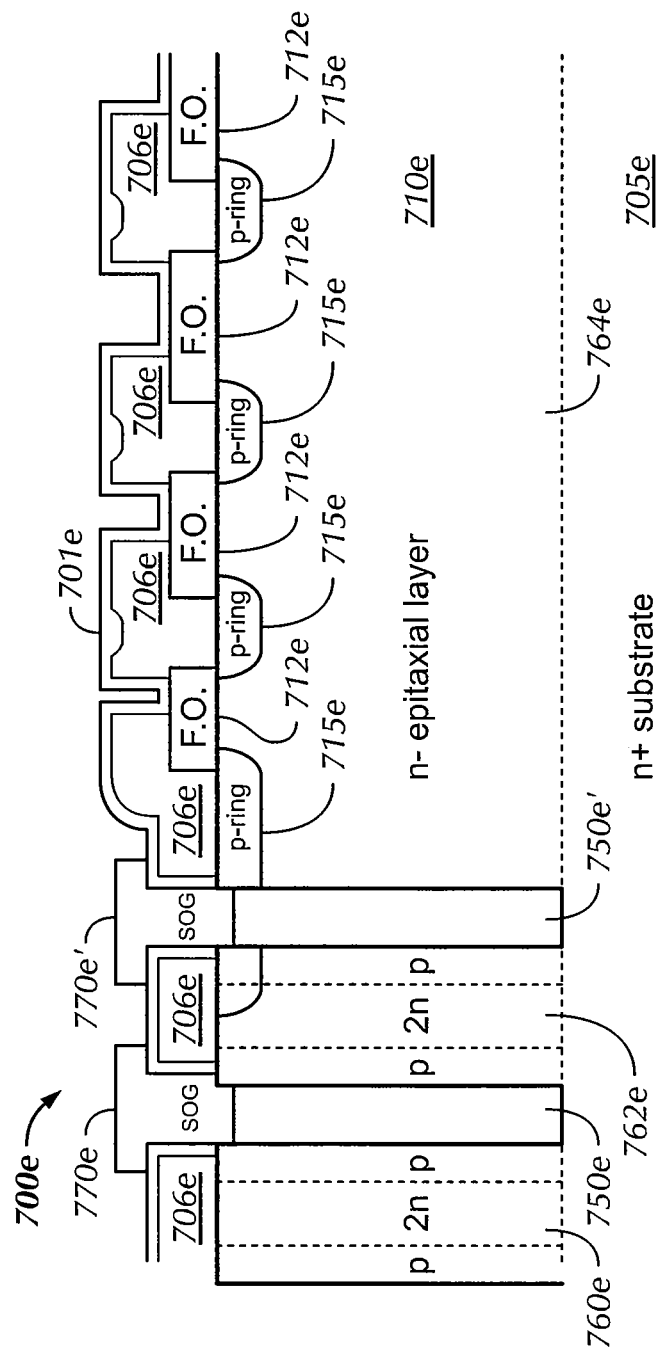

In FIG. 7E, yet another embodiment of the present invention is depicted wherein the semiconductor device 700e includes first region 760e, second region 762e, and third region 764e. First region 760e and second region 762e each comprise a superjunction Schottky diode wherein each drift region 760e, 762e comprised of epitaxial silicon layer 710e has two sidewall implants. In the embodiment depicted in FIG. 7e, the third region 764e comprises a termination region of the semiconductor device 700e wherein a plurality of implantation regions 715e disposed in the epitaxial silicon layer 710e are partially covered by field oxide regions 712e and metal contacts 706e, which are covered by a protective layer 701e. In the embodiment depicted in FIG. 7E, the protective layer 701e comprises silicon nitride. Spun on glass sealing materials 770e, 770e' are disposed above and between the metal portions 706e and partially within the trenches 750e, 750e'.

Figure 7F:
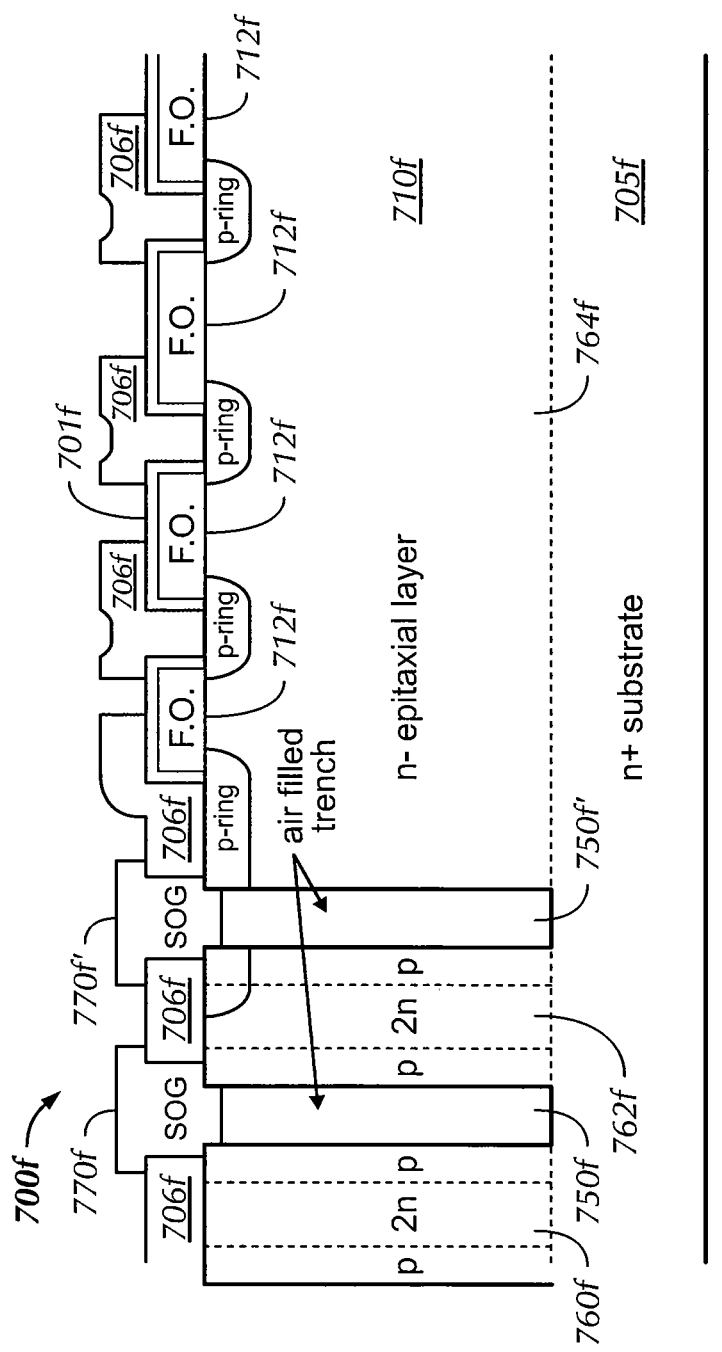

In FIG. 7F, another embodiment of the present invention is depicted wherein the semiconductor device 700f comprises a first region 760f, a second region 762f, and a third region 764f disposed above a substrate 705f. The first region 760f and the second region 762f each comprise a superjunction Schottky diode wherein each drift region 760f, 762f comprised of epitaxial silicon layer 710f has two sidewall implants. Second region 762f and third region 764f are separated by unlined trench 750f, which is sealed in an airtight manner with spun on glass sealing material 770f. First region 760f and second region 762f are separated by unlined trench 750f, which is sealed in an airtight manner with spun on glass sealing material 770f. In the embodiment depicted in FIG. 7F, spun on sealing glass materials 770f, 770f' are disposed within the unlined trenches 750f, 750f' and between metal contacts 706f. Additionally, in the embodiment depicted in FIG. 7f, in third region 764f, which comprises a termination region in the device 700f, the field oxide layers 712f disposed above the epitaxial silicon layer 710f further comprise a protective layer 701 f disposed on an upper surface thereof.

Figure 9A:
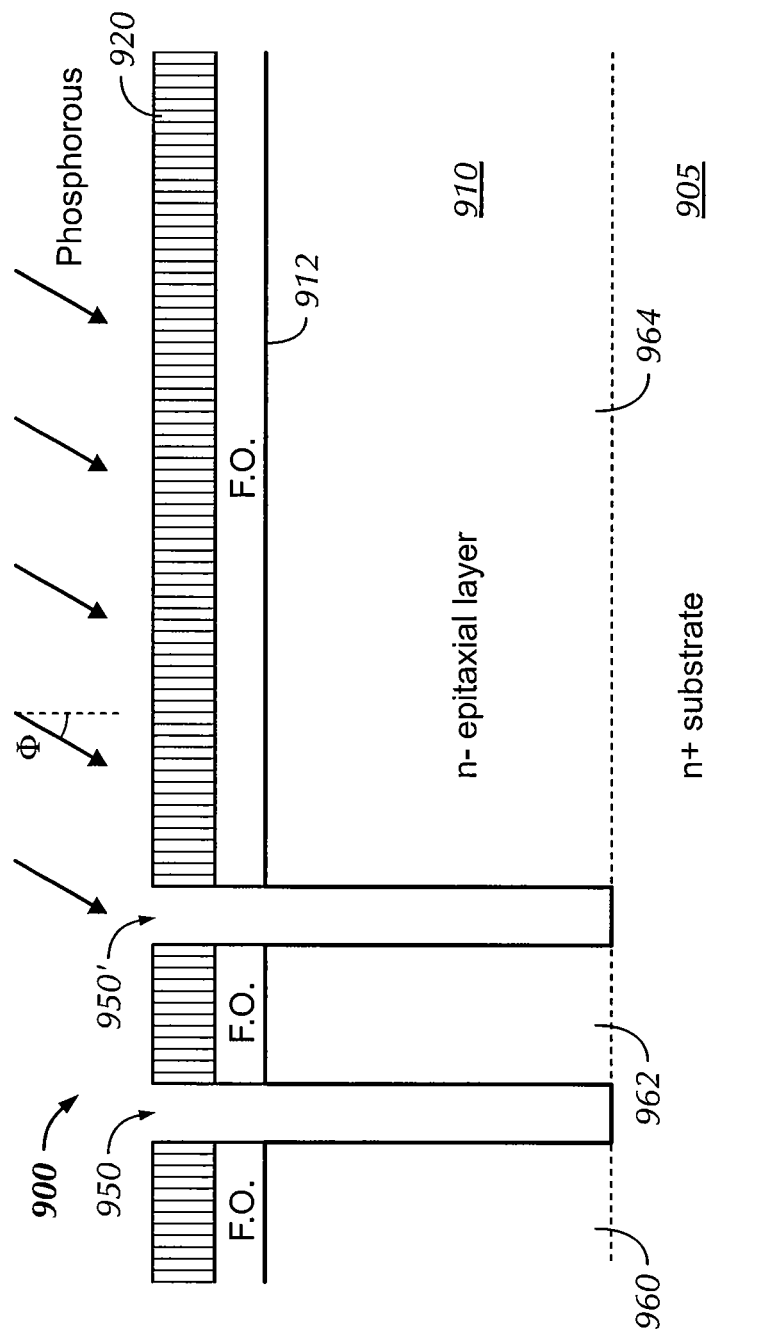
FIGS. 9A-9K are cross-sectional schematic representations of a portion of a semiconductor superjunction MOSFET device at various stages of production during a method in accordance with another embodiment of the present invention.

Certain preferred method embodiments including formation of MOSFETS are described in more detail, but without limiting the invention, with reference to FIGS. 9A through 9K. Referring to FIG. 9A, a semiconductor device 900 is provided having an epitaxial silicon layer 910, which may be doped with a dopant of a first conductivity type, e.g., n-type conductivity, disposed above a substrate 905, which may be doped with n-type conductivity in an amount greater than the epitaxial silicon layer 910. An optional field oxide ("F.O.") layer 912 is disposed above the epitaxial silicon layer 910. Such optional dielectric layers, for example, the field oxide layer 912, may be deposited via CVD or grown thermally, with a resulting layer thickness of about 0.5 µm to about 2 µm preferably about 1 µm. Unlined trenches 950, 950' are formed in the semiconductor device 900 separating first region 960, second region 962, and third region 964. A photoresist patterning layer 920 has been disposed above the optional field oxide layer 912 to provide a pattern for etching the trenches 950, 950'. The etching may be carried out via a two-step wet etching method wherein the oxide layer 912 is first removed and then the epitaxial silicon material 910 is removed. After an optional sacrificial oxide process, which helps to remove defects on the trench 950, 950' sidewall caused by etching, the semiconductor device 900 is subjected to angled ion implantation at a first angle of implantation $\Phi$ (~+4°) indicated by the arrows shown in the FIG. 9A. In the embodiment depicted in FIG. 9A, the implantation is carried out with a phosphorus (n-type) dopant to provide a heavily doped region of n-type conductivity at the sidewalls of the trenches 950, 950'.

Figure 9B:
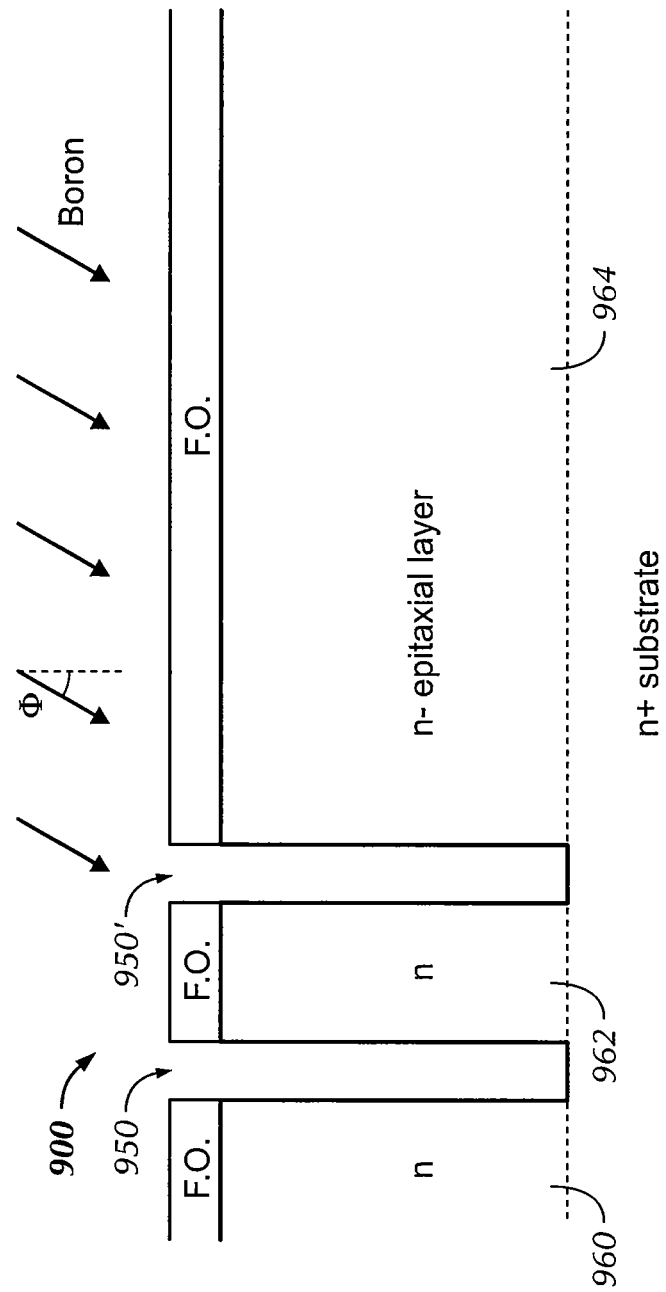

Referring to FIG. 9B, the semiconductor device 900, in which an unprotected sidewall of each of first region 960 and second region 962 have been implanted with an impurity of n-type conductivity, is then subjected to angled ion implantation with a dopant of a second conductivity type, p-type conductivity in the embodiment shown, at the first angle of implantation $\Phi$. Prior to the second implantation, the photoresist layer 920 is removed and a drive-in step is carried out on the first angled implant. After the second implantation, another drive-in step is carried out.

Figure 9C:
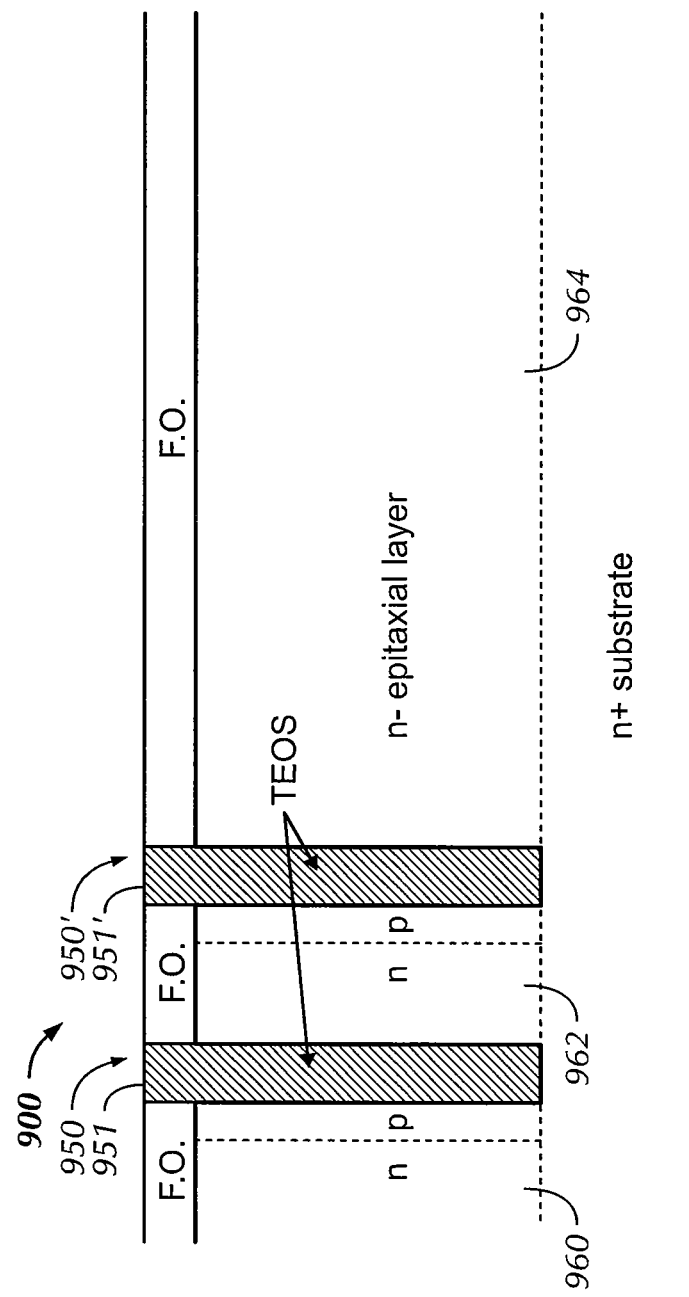

Referring to FIG. 9C, the semiconductor device 900, wherein an unprotected sidewall of region 960 and of region 962 have been implanted with an additional impurity of a second conductivity type, is subjected to a temporary trench refill process, where a temporary fill material 951, 951', such as for example, tetraethylorthosilicate (TEOS), is deposited over the semiconductor device 900 and within unlined trenches 950, 950'. A removal process is carried out, such as, for example, chemical mechanical polishing, to remove the temporary fill material which is disposed outside of trenches 950, 950'. Temporary refill materials are preferably inexpensive and easy to deposit, but do not necessarily have to be sturdy, dense, good insulators or have any particular thermal properties.

Figure 9D:
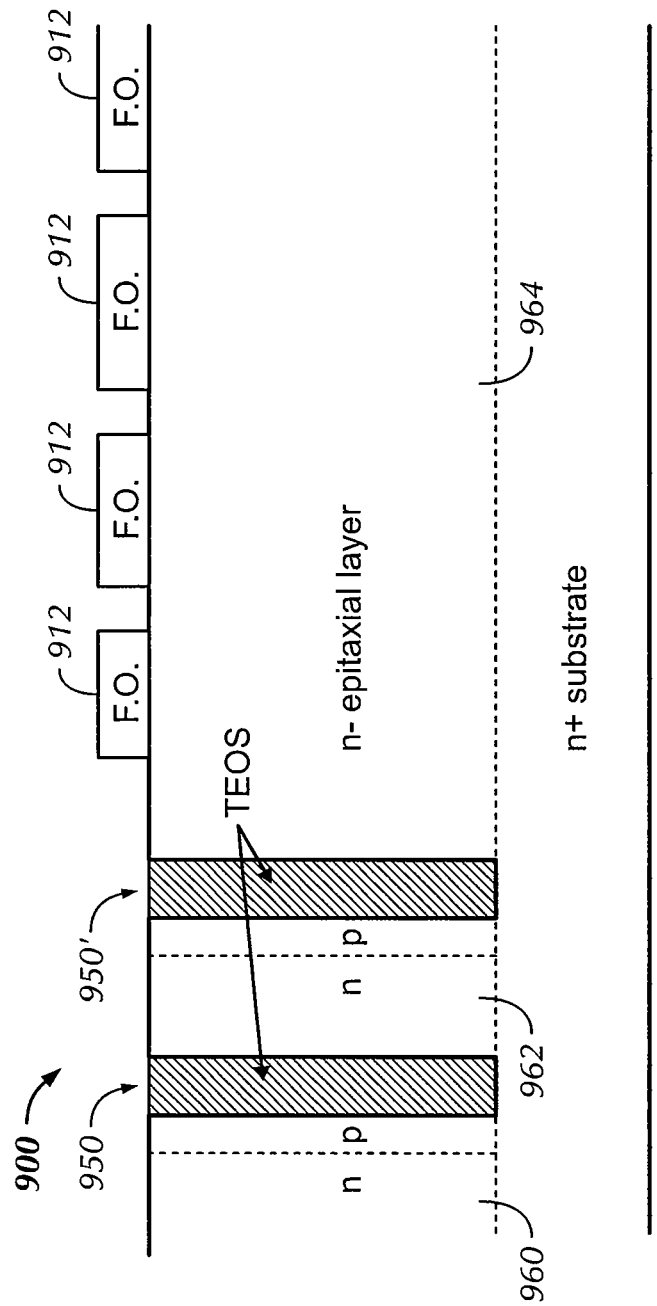

Referring to FIG. 9D, a patterning and removal procedure is carried out on the semiconductor device 900 such that the optional field oxide layer 912 is removed above first region 960 and second region 962, and is partially removed in a desired pattern above third region 964. Patterning may be carried out by depositing an active mask (not shown) of, for example, a photoresist material or a hard masking material in any desired pattern. Removal may be carried out with any suitable etching procedure for removing the field oxide material 912. Suitable patterning can include, for example, a repeating segment of openings over a region, such as is depicted in FIG. 9D over third region 964, to provide a pattern for concentric diffusion rings in a termination region.

Figure 9E:
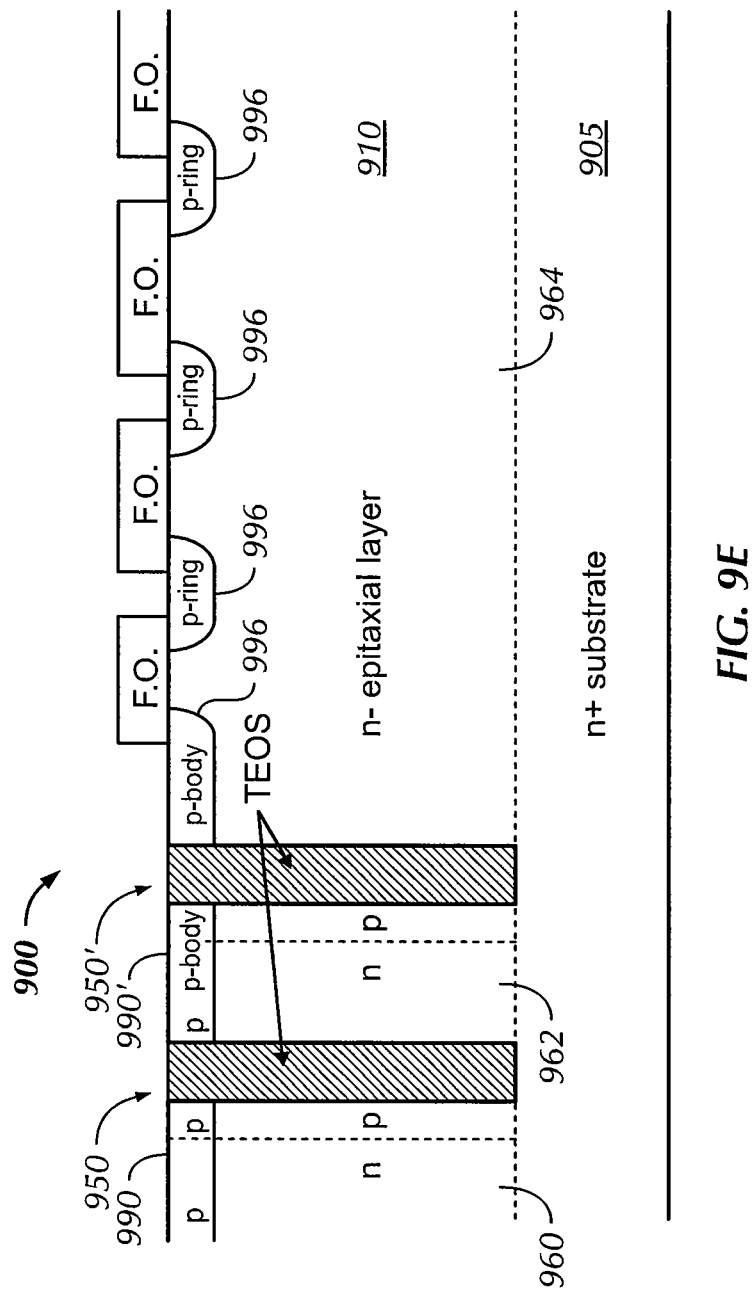

In FIG. 9E, the semiconductor device 900 is subjected to a doping procedure using a dopant of the second conductivity type (opposite conductivity of the epitaxial layer 910 conductivity) to create diffusion region 990 in first region 960, diffusion region 990' in second region 962, and diffusion regions 996 in third region 964. Diffusion regions 996 may be patterned and implanted as concentric ring formations around an active region and may serve as part of a termination region in a superjunction device. After the implantation depicted in FIG. 9E, a drive-in step may be carried out.

Figure 9F:
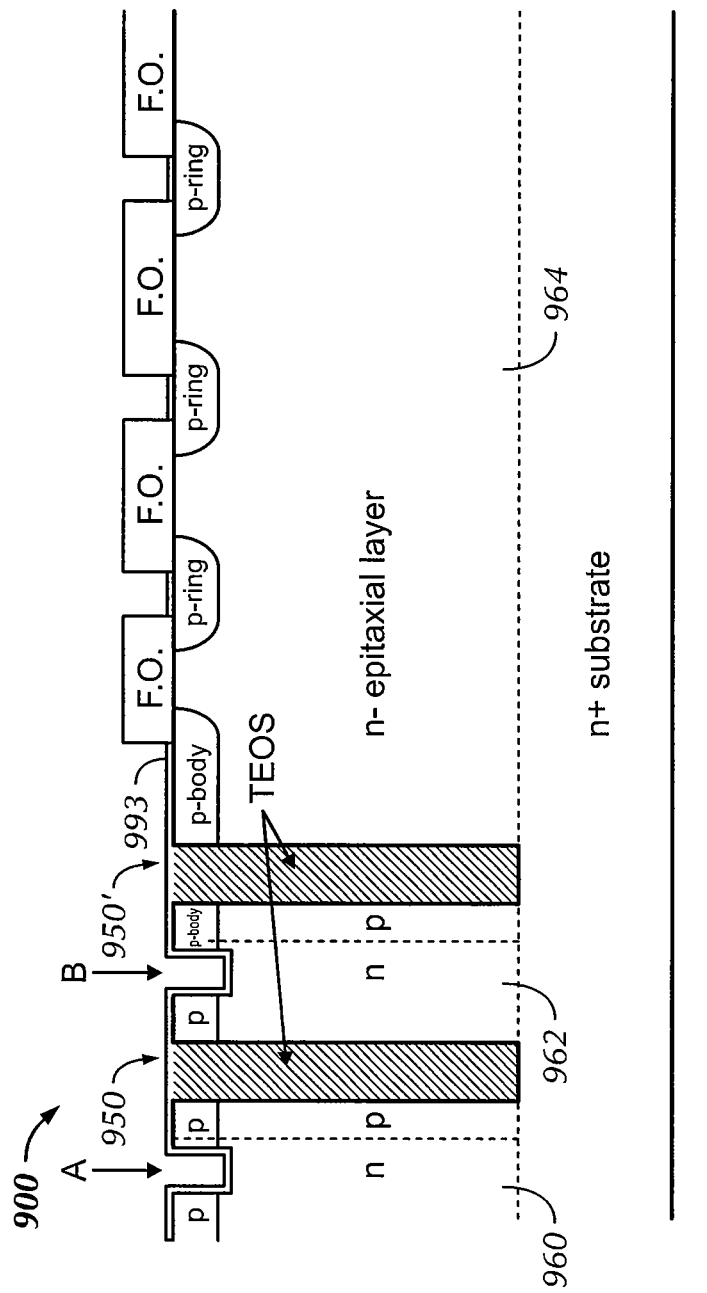

In FIG. 9F, gate recesses A and B are formed in first region 960 and second region 962, respectively. Formation of gate recesses A, B may include formation of a gate recess patterning layer (not shown), followed by etching, and an optional sacrificial oxide process that smoothes the surface of the gate recesses A, B. Subsequent to the formation of gate recesses A, B, a gate oxide layer 993 is disposed above the semiconductor device 900. In certain preferred embodiments, the gate oxide layer 993 may be thermally grown.

Figure 9G:
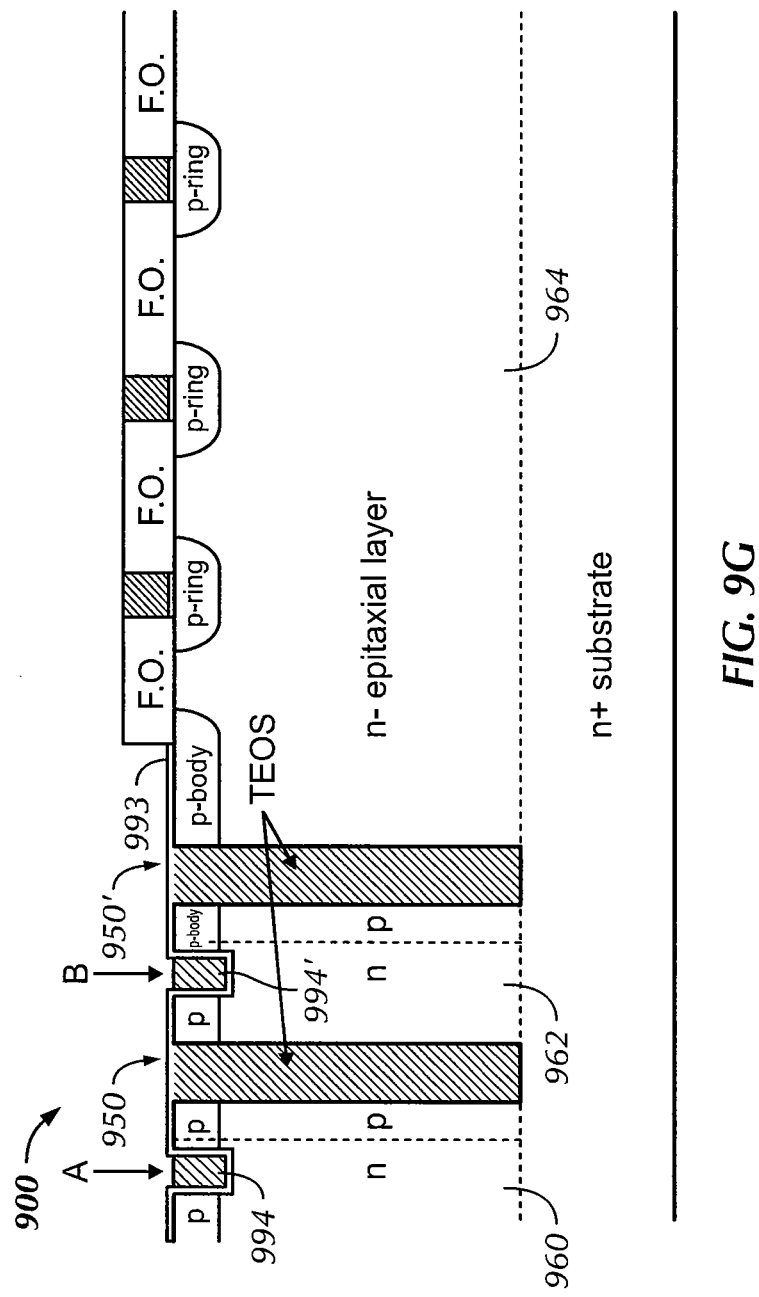

In FIG. 9G, a gate material is disposed in gate recesses A, B, for example, by deposition of the gate material above the semiconductor device 900 and removal of the gate material in areas outside of the gate recesses A,B to form gates 994 and 994'. One suitable method of forming gates 994, 994' includes deposition of polysilicon above the gate oxide layer 993 and in gate recesses A, B, followed by an etch-back procedure to remove the polysilicon outside of gate recesses A, B. Optionally, the polysilicon may be doped with a dopant of either conductivity type. Doping of the polysilicon may be carried out via, for example, ion implantation either prior to or subsequent to the etch-back procedure, or may alternatively be carried out during the deposition of the polysilicon.

Figure 9H:
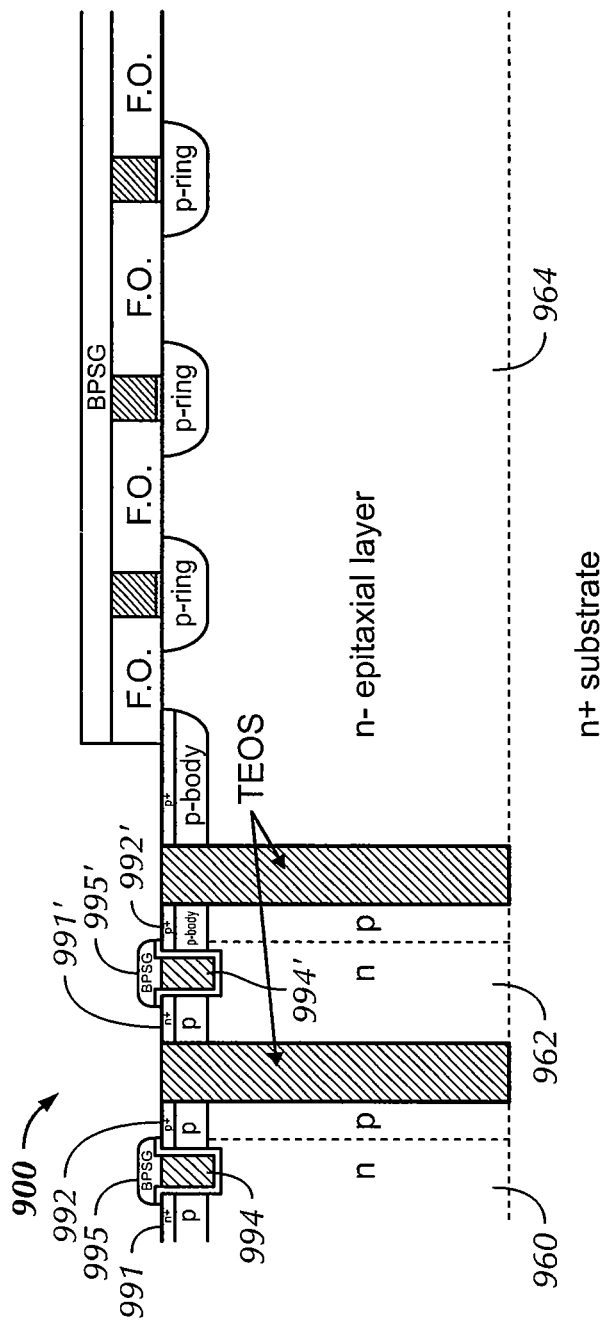

In FIG. 9H, the first region 960 and second region 962 are provided with MOSFET structures by creating diffusion regions 991, 991', 992, and 992' of either the same or different conductivity types on opposing sides of gates 994, 994', and subsequently covering the gate material with the deposition of a gate insulating layer 995, 995'. In certain embodiments of the present invention, such as depicted in FIG. 9*h*, the gate insulating layer 995, 995' is BPSG. The provision of diffusion regions 991, 991', 992, 992' can be carried out via any suitable patterning and doping procedure and may optionally include a thermal drive-in of a dopant. For example, photoresist layer masking, ion implantation and heat activated diffusion (drive-in) may be carried out. When the diffusion regions 991, 991', 992, 992' on opposite sides of the gate 994, 994' are of opposite conductivity, the doping level of the source side region may be greater than the opposite region doping level so that the lesser doped region may be blanket implanted without affecting the source side doping.

Figure 9I:
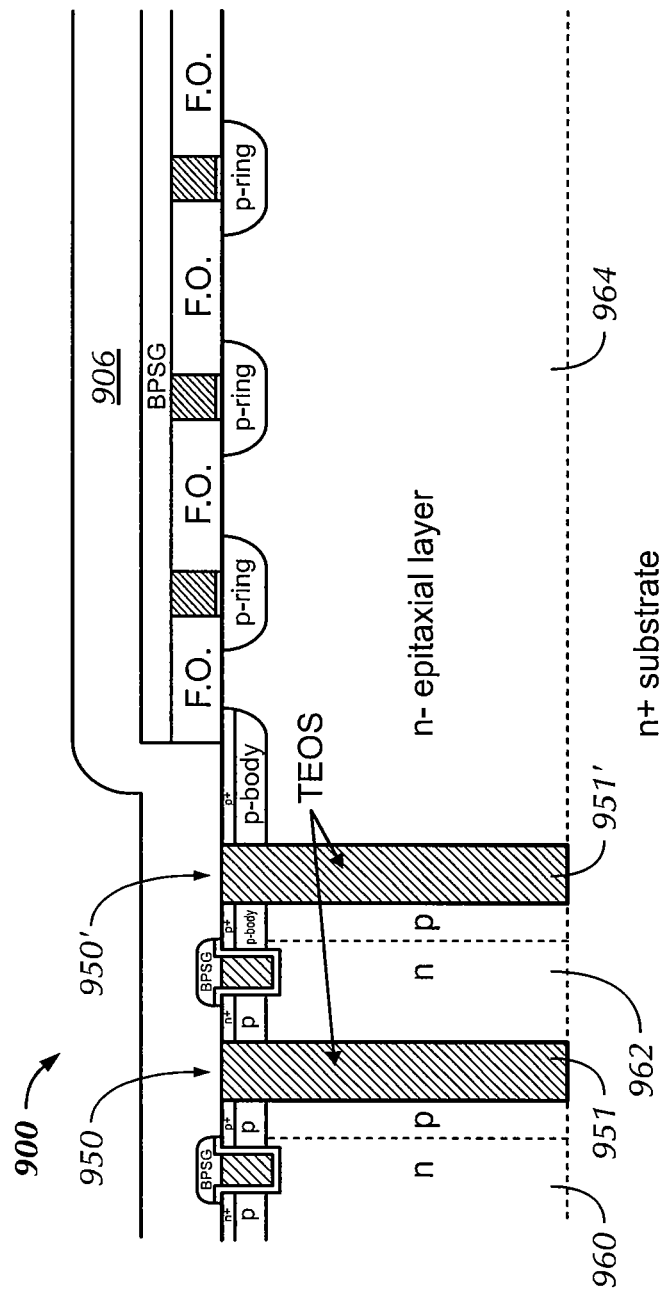
Figure 9J:
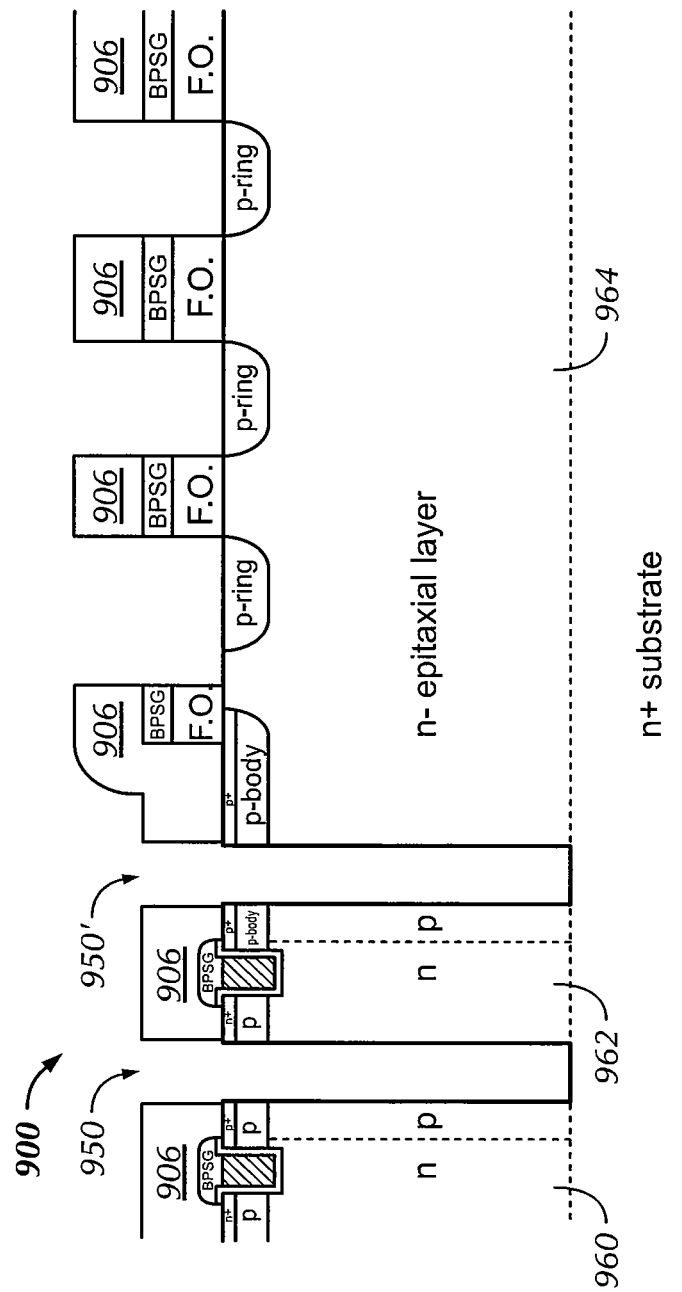

In FIG. 9I, a metal layer 506 is deposited above the semiconductor device 900. In FIG. 9*j*, the semiconductor device 900 is subjected to removal of portions of the metal layer 506 and the temporary trench refill material 951, 951'. The process includes the deposition of a patterning layer (not shown) e.g., a photoresist patterning material, above the metal layer 506, and subsequent etching of the metal 506 and the temporary trench fill material 951, 951' using the same patterning layer. After removal of the temporary fill material 951, 951', the patterning layer can be removed.

Figure 9K:
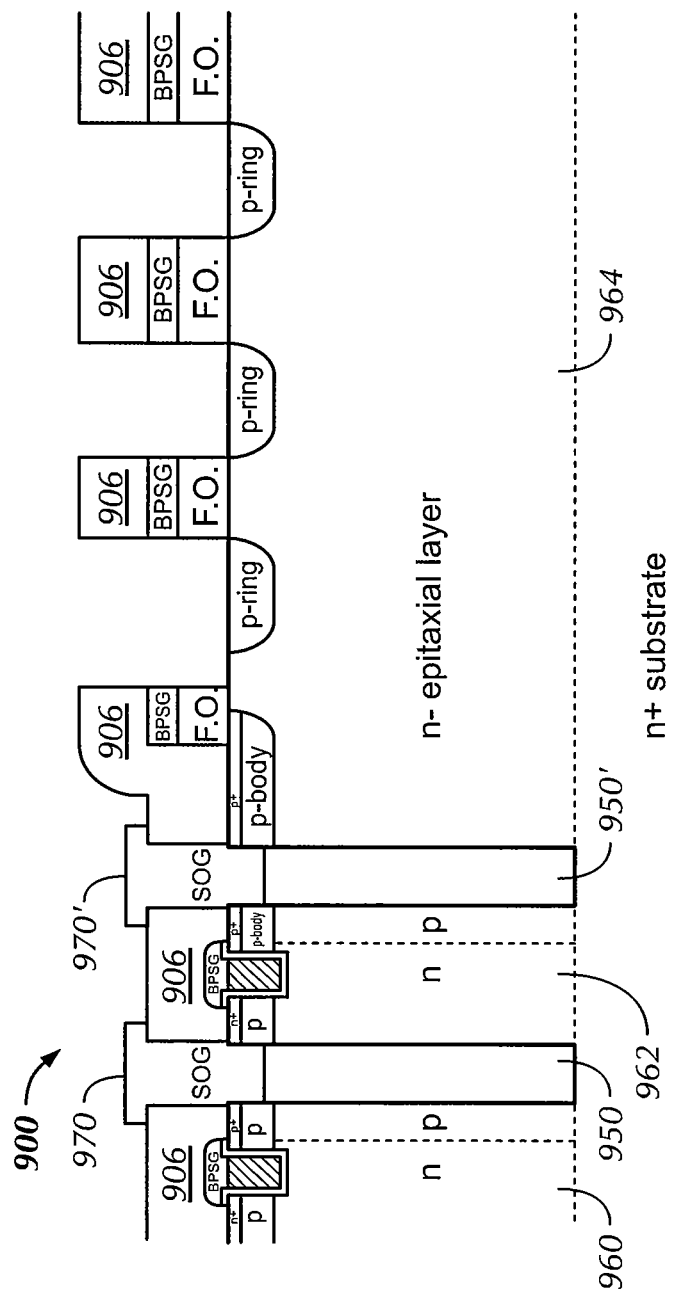

In FIG. 9K, the unfilled and unlined trenches 950, 950' are hermetically sealed with a sealing material 570, 570', such as, for example, spun on glass, via the deposition of a spun on glass layer above the semiconductor device 900, subsequent patterning of the spun on glass layer and removal of the spun on glass material such that the remaining spun on glass is disposed above the unlined trenches 950, 950'. As depicted in FIG. 9K, the spun-on glass sealing material 570, 570' may be disposed between the metal 506 remaining above the mesas 960, 962 and partially within the trenches 950, 950'.

Figure 10A:
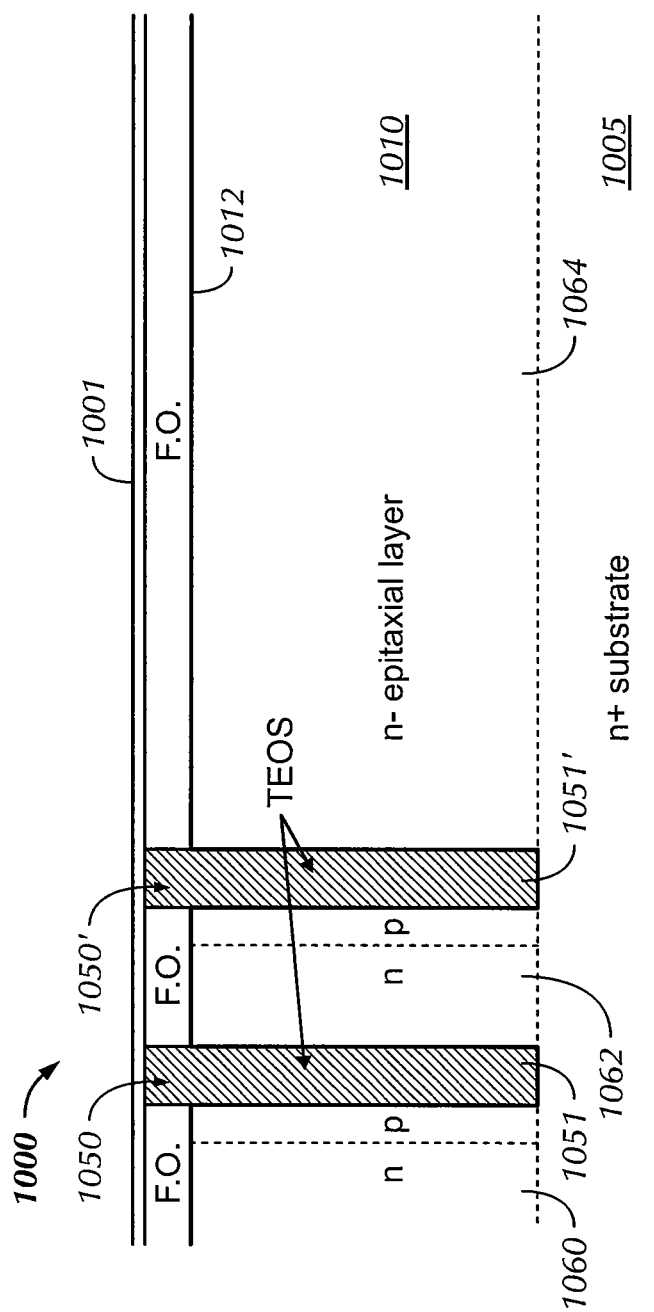
FIGS. 10A-10G are cross-sectional schematic representations of a portion of a semiconductor superjunction MOSFET device at various stages of production during a method in accordance with another embodiment of the present invention.

An additional preferred embodiment of the present invention is described in more detail, but without limiting the invention, with reference to FIGS. 10A through 10G. In FIG. 10A, a semiconductor device 1000 is provided with a protective layer 1001 above the partially formed device 1000, which includes an epitaxial silicon layer 1010 doped with a first conductivity type disposed above a substrate 1005, which is doped with a dopant of the first conductivity type in an amount greater than the epitaxial silicon layer 1010. A first region 1060, a second region 1062, and a third region 1064, are formed in the epitaxial silicon layer 1010 and separated by trenches 1050, 1050'. The protective layer 1001 may be, for example, silicon nitride. At the stage of the method depicted in FIG. 10A, in accordance with one embodiment of the present invention, trenches 1050, 1050' have been filled with temporary refill material 1051, 1051', such as described above with reference to FIG. 9C. In reference to FIGS. 6A through 6G, it is to be understood that the elements and methods of the embodiments depicted in FIGS. 5A through 5K and described above, are applicable to the embodiments depicted in FIGS. 6A through 6G, where similar and not otherwise indicated. For example, a field oxide layer 1012 may be formed in the embodiments depicted in FIGS. 10A through 10G in a similar fashion as in the embodiments depicted in FIGS. 9A through 9K.

Figure 10B:
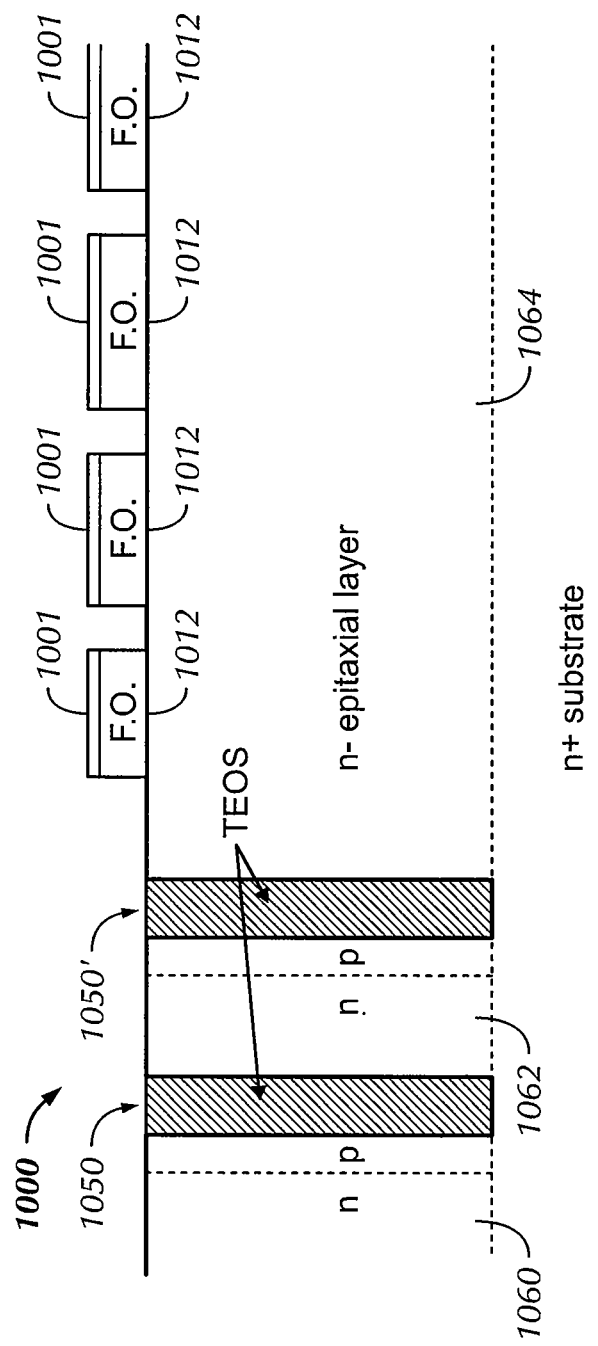

In FIG. 10B, the protective layer 1001 and field oxide layer 1012 have been selectively removed above first region 1060 and second region 1062, and portions of third region 1064. Removal may be carried out via any suitable patterning and one or more etching methods to remove the selected portions of the protective layer 1001 and the field oxide 1012.

Figure 10C:
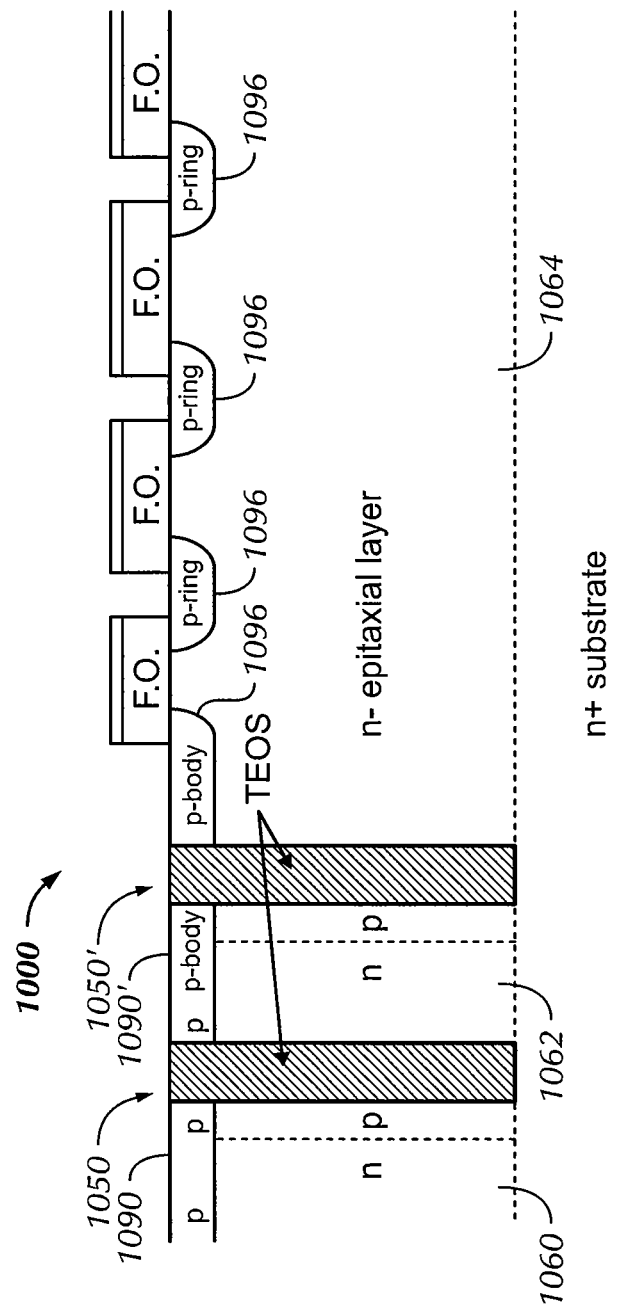

In FIG. 10C, an implant of a second conductivity type has been carried out such that the first region 1060, the second region 1062, and unprotected portions of the third region 1064 include implantation regions 1090, 1090', and 1096, respectively, of the second conductivity type. An optional drive-in may be carried out to improve diffusion of one or more of the implant regions 1090, 1090', 1096.

Figure 10D:
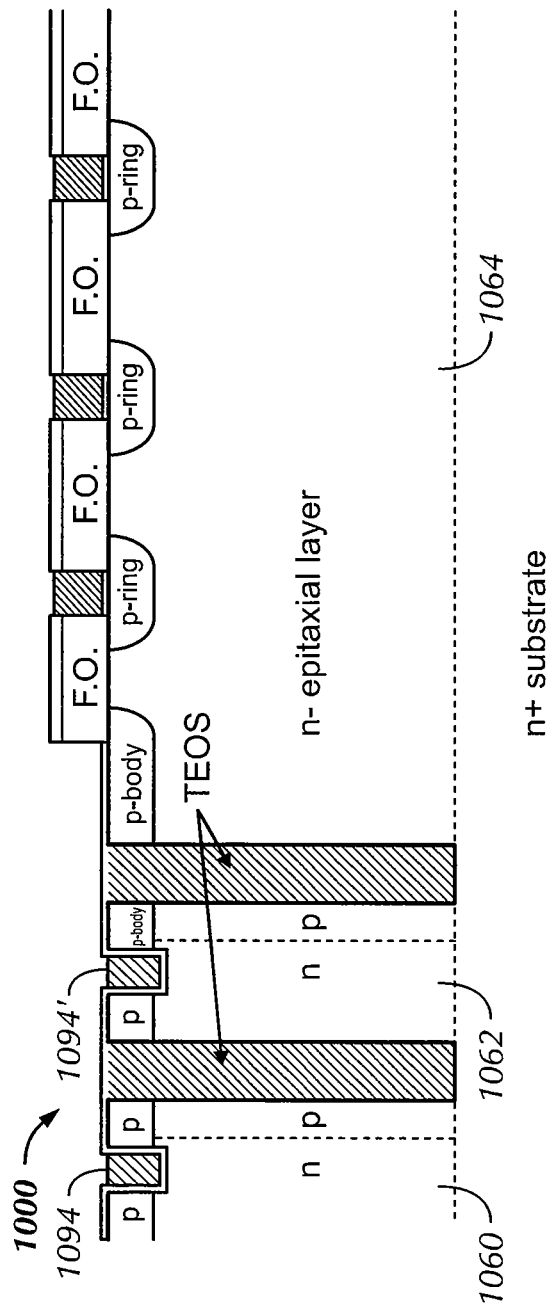
Figure 10E:
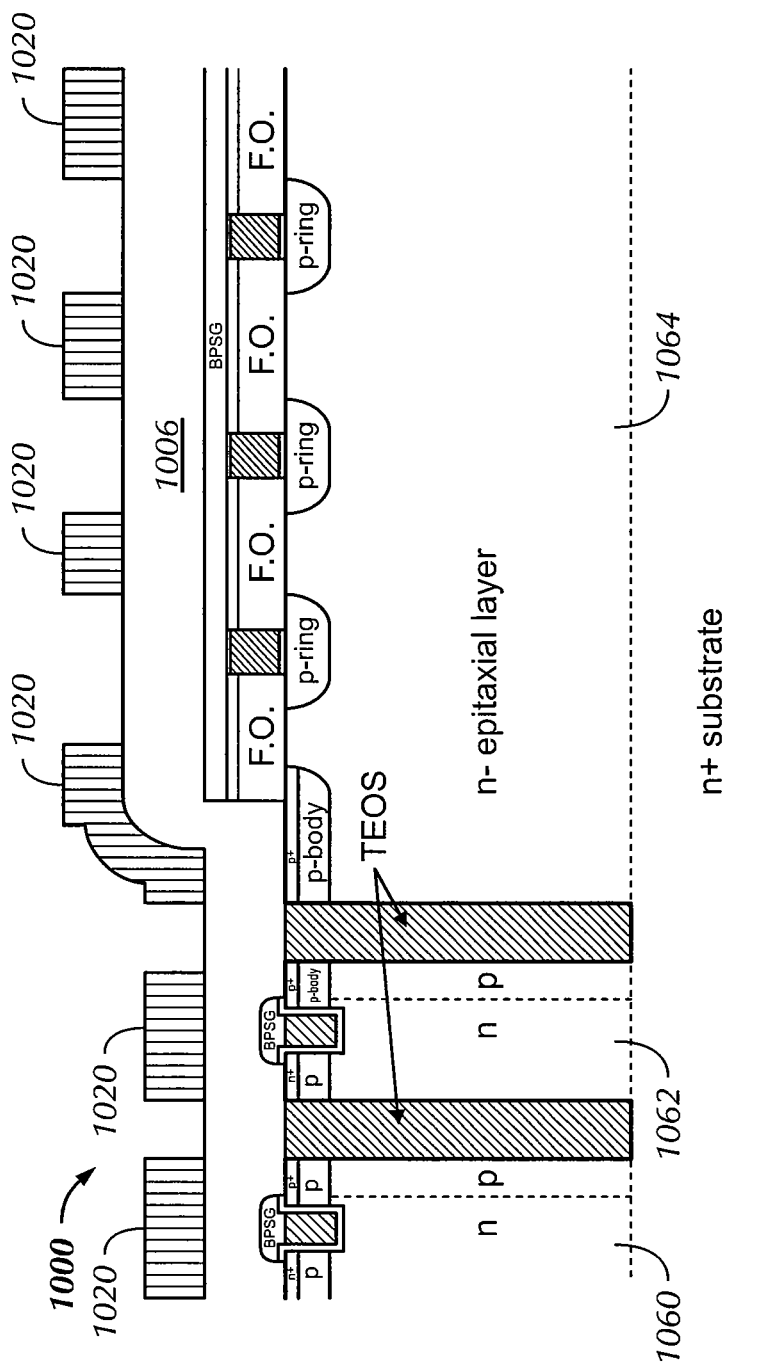

In FIG. 10D, the semiconductor device 1000 is provided with a gate 1094 in first region 1060 and a gate 1094' in second region 1062. Referring to FIG. 10E, the semiconductor device 1000 is provided with a metal layer 1006 disposed above the semiconductor device 1000 and subsequently is patterned with a photoresist material 1020 disposed above the metal layer 1006. As shown in FIG. 10E, the first region 1060 and the second region 1062 have also been provided with MOSFET structures of the type described above.

Figure 10F:
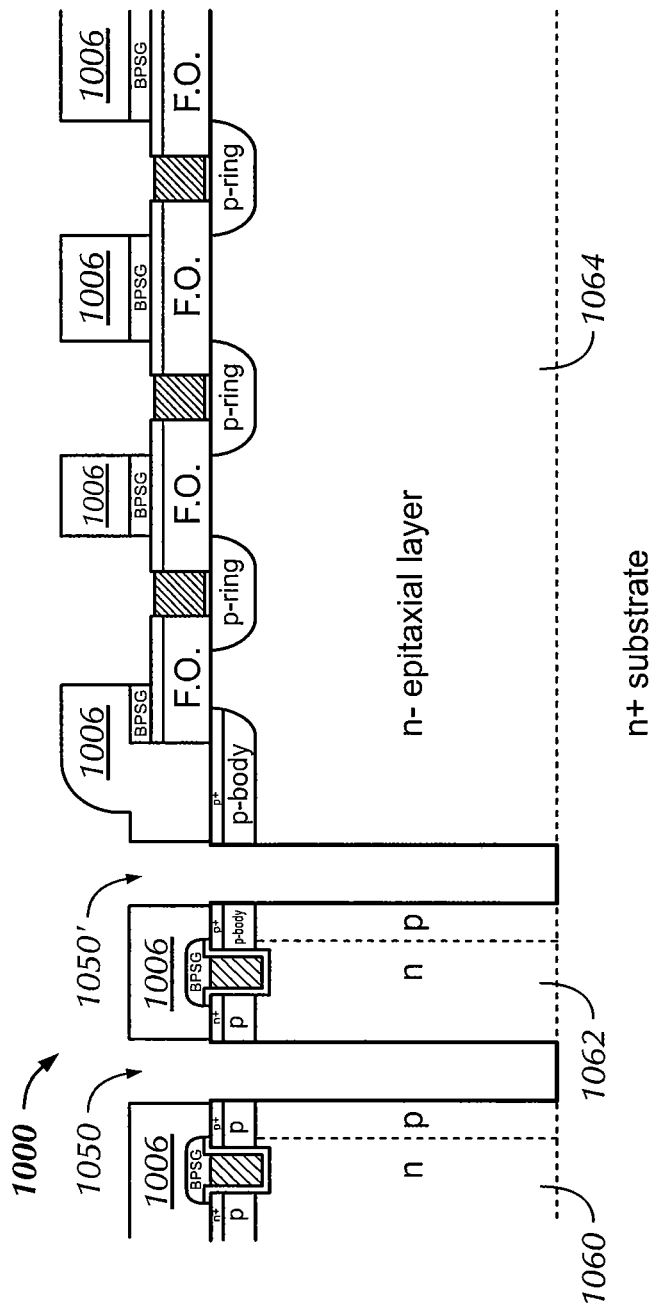
Figure 10G:
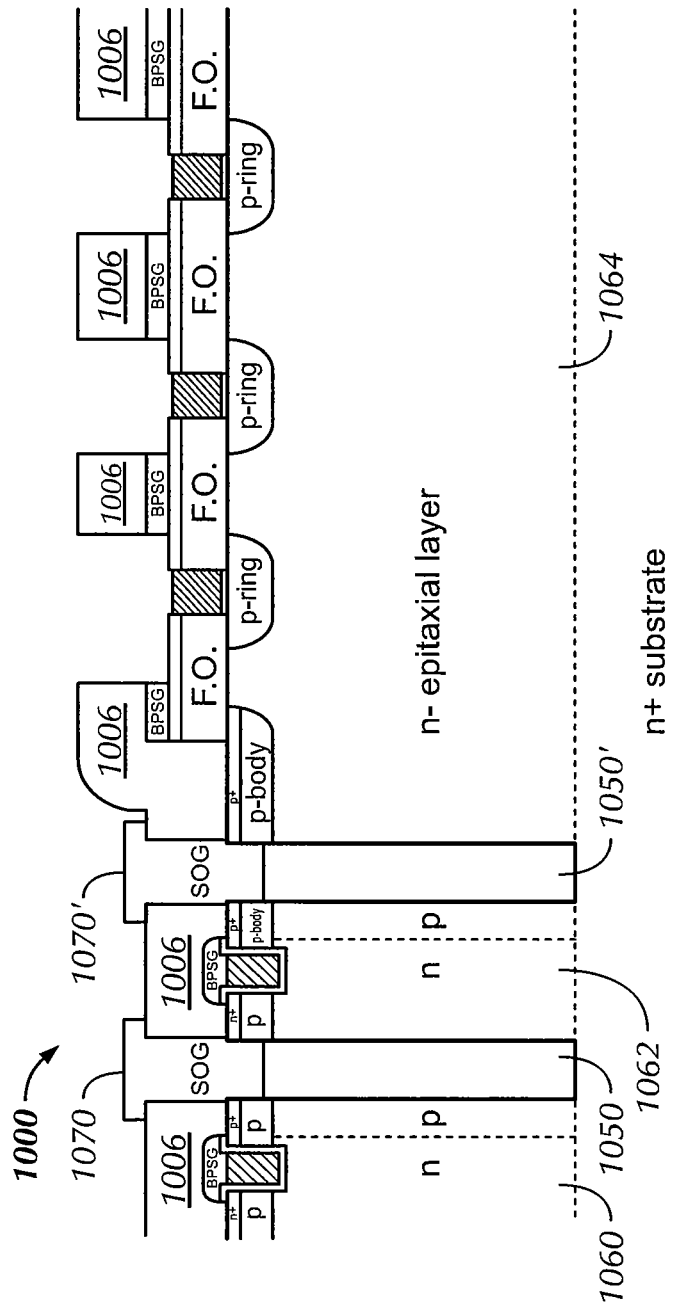

In FIG. 10F, the metal layer 1006 is etched in accordance with the photoresist pattern 1020 and the temporary refill material 1051, 1051' is removed from unlined trenches 1050, 1050'. Due to the selectiveness of the etching recipes, polysilicon disposed in the field recesses of the termination region are not removed. However, the functionality of the semiconductor device 1000 is not affected should the polysilicon be removed. In FIG. 10G, a sealant material 1070, 1070' is provided over the trenches 1050, 1050' via deposition of a spun-on glass layer, providing a patterning layer (not shown) above the spun-on glass layer, and subsequent selective removal of the spun-on glass layer according to the patterning layer, such that the semiconductor device 1000 is left with a spun-on glass sealing material 1070, 1070' disposed above the unlined trenches 1050, 1050'.

Figure 11A:
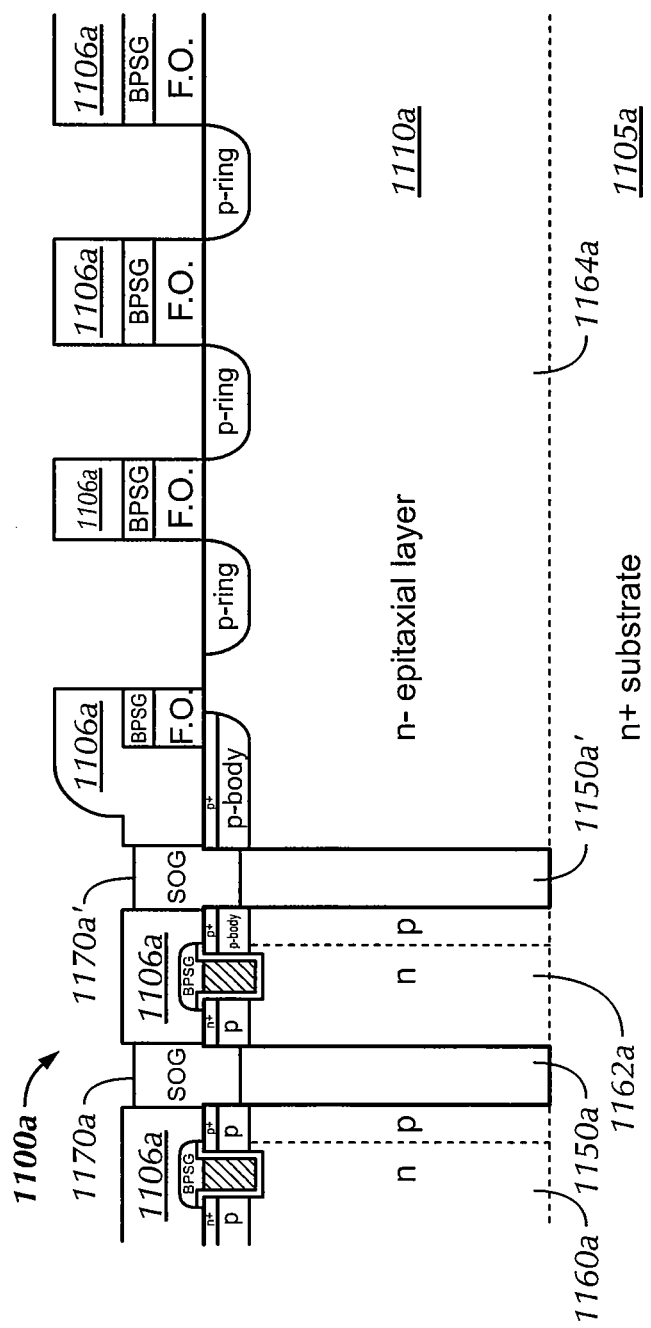
FIGS. 11A-11E are partial cross-sectional schematic representations of superjunction MOSFET devices prepared in accordance with four different embodiments of the present invention.

Additional preferred embodiments of the present invention are described in more detail, but without limiting the invention, with reference to FIGS. 11A through 11E. In FIG. 11A, a semiconductor device 1100a includes a first region 1160a, a second region 1162a, and a third region 1164a, disposed above a substrate 1105a. The first region 1160a includes a superjunction MOSFET. Second region 1162a also includes a superjunction MOSFET and third region 1164a includes a termination region. First region 1160a and second region 1162a are separated from the third region 1164a by unlined trench 1150a', which is sealed in an airtight manner with spun on glass sealing material 1170a'. First region 1160a and second region 1162a are separated from one another by unlined trench 1150a, which is sealed in an airtight manner with spun on glass sealing material 1170a. In the embodiment depicted in FIG. 11A, the spun-on glass sealing material 1170a, 1170a' is disposed entirely between portions of the metal 1106a deposited above the mesas of the three regions 1160a, 1162a, 1164a. Suitable formation of sealing materials disposed entirely between portions of the metal 1106a may be carried out by depositing a coating of the sealing material above the semiconductor device 1100a and carrying out a blanket etching process over the entire surface. In such embodiments, one less masking step is used.

Figure 11B:
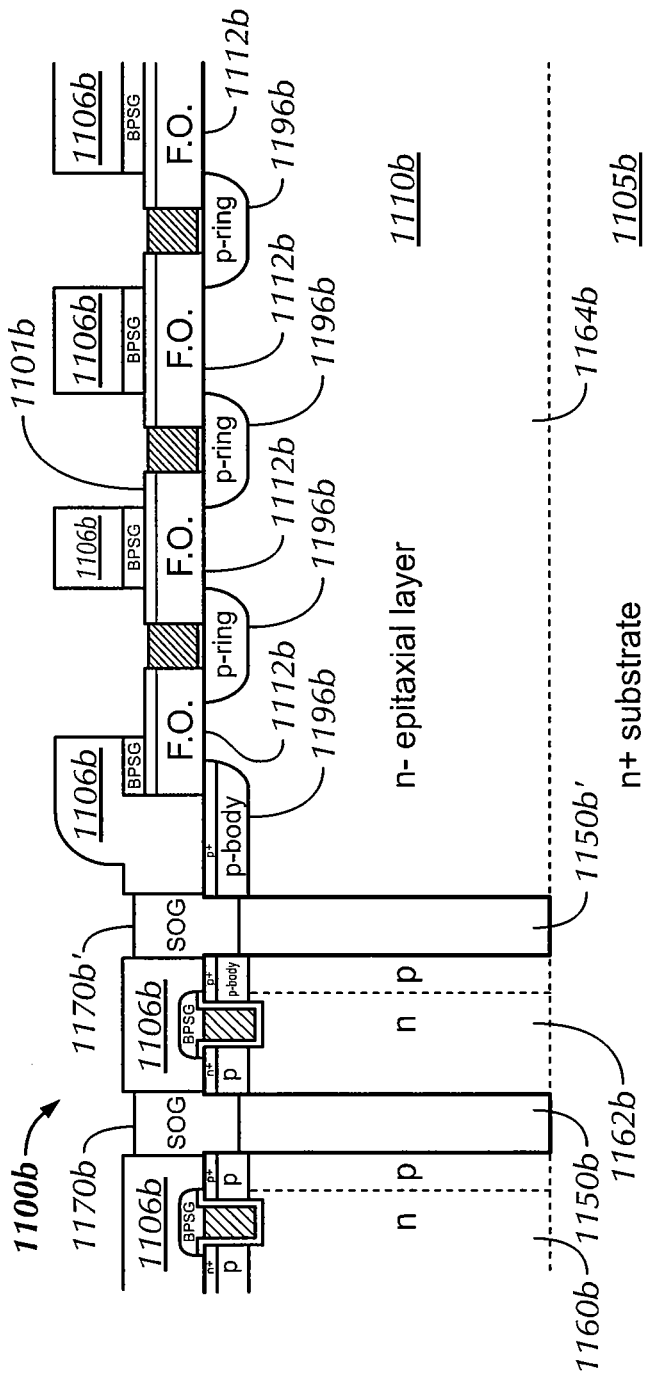

In FIG. 11B, a semiconductor device 1100b includes a first region 1160b, a second region 1162b, and a third region 1164b disposed above a substrate 1105b. First region 1160b includes a superjunction MOSFET, second region 1162b also includes a superjunction MOSFET, and third region 1164 includes a termination region. First region 1160b and second region 1162b are separated from third region 1164b by unlined trench 1150b', which is sealed in an airtight manner with spun on glass sealing material 1170b'. First region 1160b is separated from second region 1162b by unlined trench 1150b, which is sealed in an airtight manner with spun on glass sealing material 1170b. The third region 1164, which includes a termination region of the semiconductor device 1100b, is provided with a plurality of implantation regions 1196b disposed in the epitaxial silicon layer 1110b, which are partially covered by field oxide regions 1112b, which are covered by a protective layer 1101b. In the embodiment depicted in FIG. 11B, the protective layer 1101b is silicon nitride. Sealing materials 1170b, 1170b' are disposed between the metal portions 1106b and partially within the trenches 1150b, 1150b' for sealing the trenches 1150b, 1150b'.

Figure 11C:
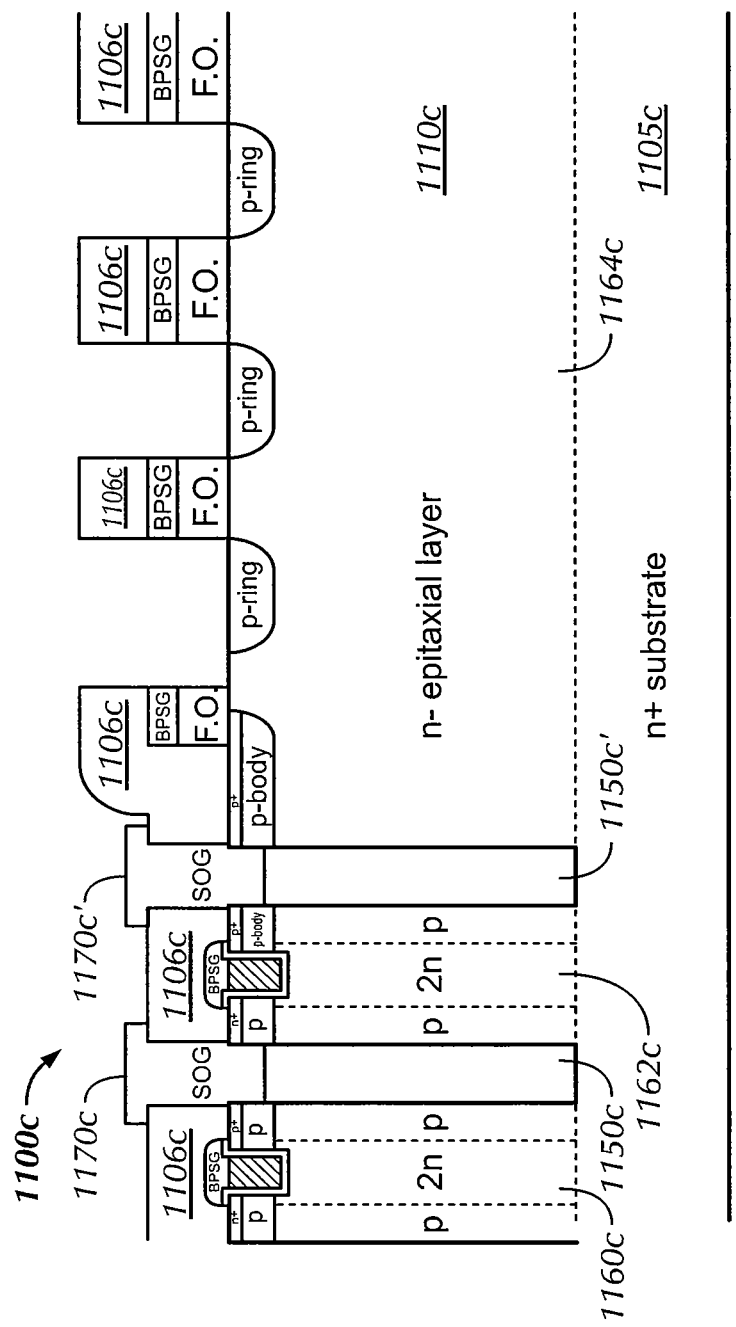

In FIG. 11C, a semiconductor device 1100c includes a first region 1160c, a second region 1162c, and a third region 1164c. First region 1160c and second region 1162c each include a superjunction MOSFET wherein each drift region 1160c, 1162c comprised of epitaxial silicon layer 1110c has two sidewall implants. In the embodiment depicted in FIG. 11C, the unlined trenches 1150c, 1150c' are sealed in an airtight manner with spun on glass sealing material 1170c, 1170c', respectively. Spun on glass sealing materials 1170c, 1170c' are disposed above and between the metal portions 1106c and partially within the trenches 1150c, 1150c' for sealing the trenches 1150c, 1150c'.

Figure 11D:
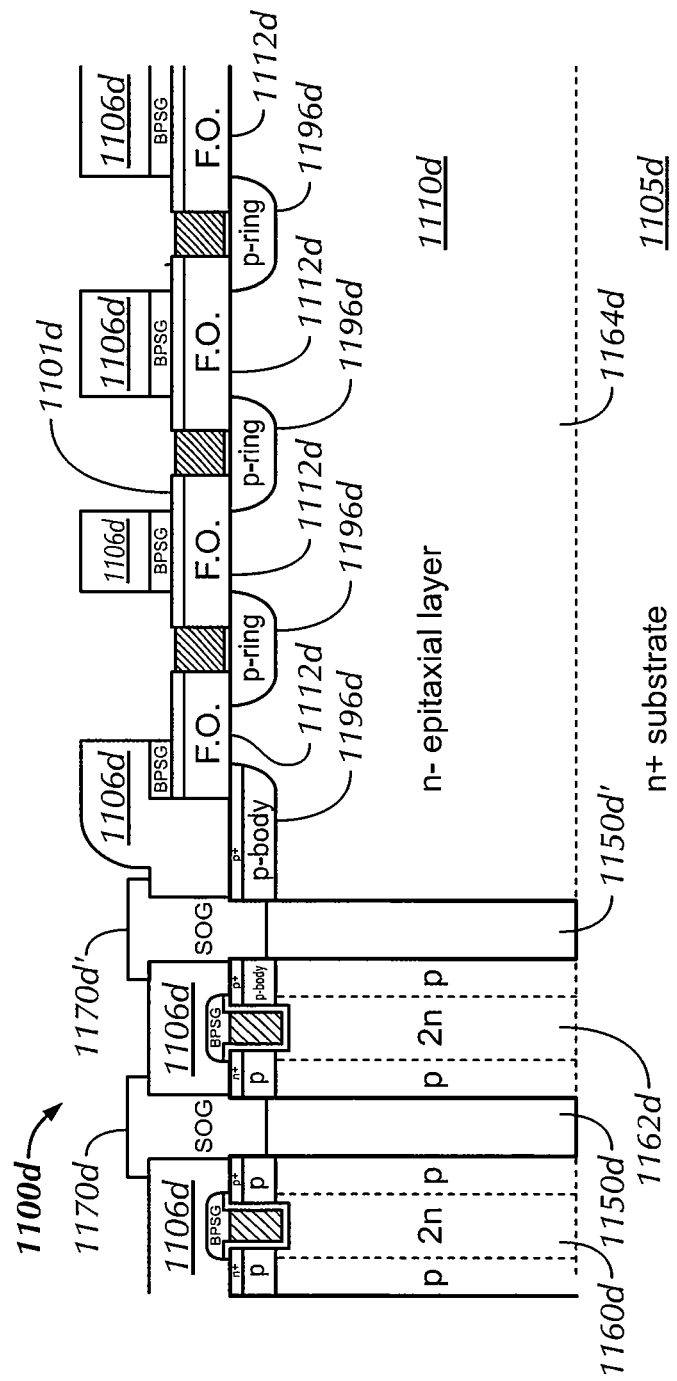

In FIG. 11D, a semiconductor device 1100d includes first region 1160d, second region 1162d, and third region 1164d.

First region 1160d and second region 1162d each include a superjunction MOSFET wherein each drift region 1160d, 1162d comprised of epitaxial silicon layer 1110d has two sidewall implants. In the embodiment depicted in FIG. 11D, the third region 1164d includes a termination region of the semiconductor device 1100d wherein a plurality of implantation regions 1196d disposed in the epitaxial silicon layer 1110d are partially covered by field oxide regions 1112d, which are covered by a protective layer 1101d. In the embodiment depicted in FIG. 11D, the protective layer 1101d is silicon nitride. Spun on glass sealing materials 1170d, 1170d' are disposed above and between the metal portions 1106d and partially within the trenches 1150d, 1150d' for sealing the trenches 1150d, 1150d'.

Figure 11E:
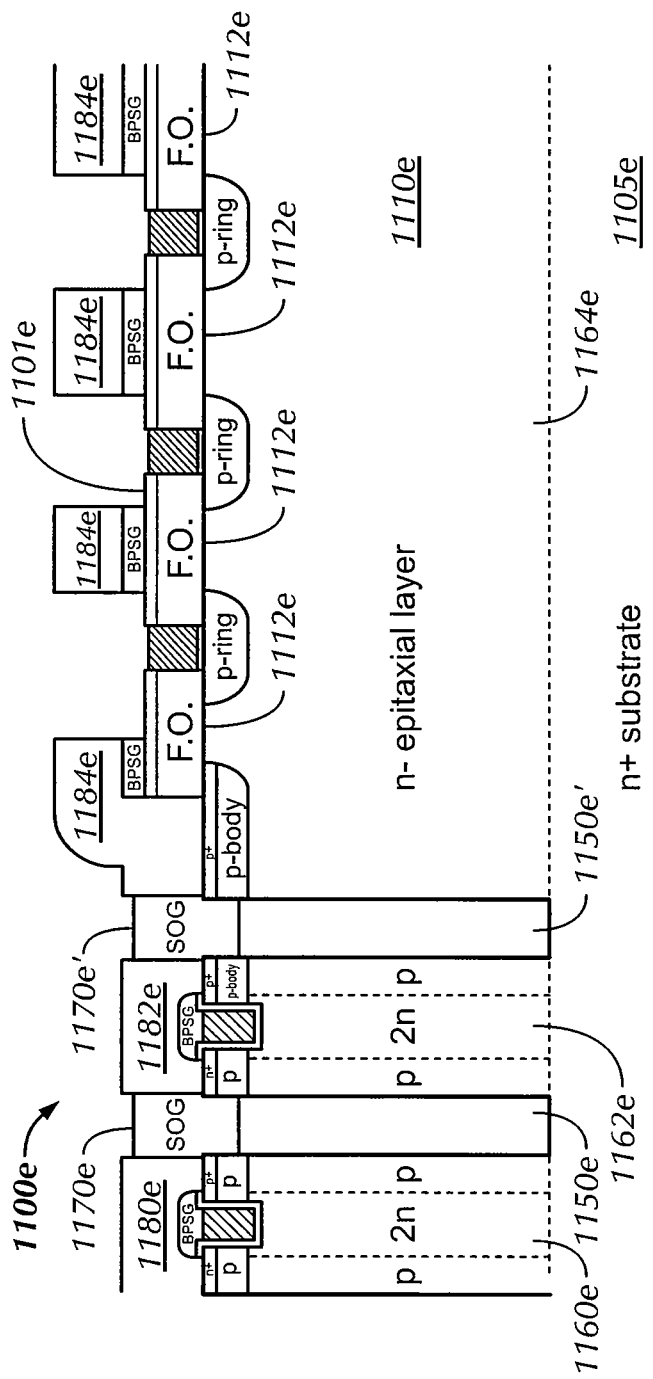

In FIG. 11E, a semiconductor device 1100e includes a first region 1160e, a second region 1162e, and a third region 1164e disposed above a substrate 1105e. The first region 1160e and the second region 1162e each include a superjunction MOSFET wherein each drift region 1160e, 1162e of epitaxial silicon layer 1110e has two sidewall implants. Second region 1162e and third region 1164e are separated by unlined trench 1150e', which is sealed in an airtight manner with spun on glass sealing material 1170e'. First region 1160e and second region 1162e are separated by unlined trench 1150e, which is sealed in an airtight manner with spun on glass sealing material 1170e. In the embodiment depicted in FIG. 11E, spun on sealing glass materials 1170e, 1170e' are disposed within the unlined trenches 1150e, 1150' and between metal contacts 1180e, 1182e, and 1184e. Additionally, in the embodiment depicted in FIG. 11E, third region 1164e, which includes a termination region in the semiconductor device 1100e, the field oxide layers 1112e disposed above the epitaxial silicon layer 1110e further include a protective layer 1101e disposed on an upper surface thereof.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the embodiments of the present invention as defined by the appended claims.

What is claimed is:

1. A semiconductor device comprising:
   a semiconductor material layer having a first region and a second region separated by an unlined trench disposed in the semiconductor material layer, the trench having sidewalls comprised of the semiconductor material, the trench being sealed with a sealing material such that the trench is air-tight;
   a first metal contact disposed above and in contact with at least a portion of the first region of the semiconductor material layer proximate to the trench; and
   a second metal contact disposed above and in contact with at least a portion of the second region of the semiconductor material layer proximate to the trench,
   at least a portion of the sealing material being disposed over the trench and between the first metal contact and the second metal contact.

2. The semiconductor device of claim 1, wherein the semiconductor material layer comprises epitaxial silicon doped with a dopant of a first conductivity type disposed above a substrate comprising silicon doped with a dopant of the first conductivity type in an amount greater than the epitaxial silicon, and wherein at least one of the first region and the second region comprises a superjunction device.

3. The semiconductor device of claim 2, wherein the first region comprises an active device region and the second region comprises a termination region.

4. The semiconductor device of claim 3, wherein the active device region comprises one of a superjunction Schottky diode structure, a field-effect-transistor, and a MOSFET structure.

5. The semiconductor device of claim 1, wherein the air-tight trench contains a gas comprising at least one selected from inert gases and air.

6. The semiconductor device of claim 5, wherein the gas has a pressure lower than about standard atmospheric pressure.

7. The semiconductor device of claim 5, wherein the gas has a moisture content less than or equal to about 5%.

8. The semiconductor device of claim 1, wherein the sealing material comprises spun-on glass.

9. The semiconductor device of claim 1, wherein the first region comprises one of a superjunction Schottky diode and a first field-effect-transistor and the second region comprises a matching one of a second superjunction Schottky diode and a second field-effect-transistor.

10. The semiconductor device of claim 1, wherein the semiconductor material layer further comprises a plurality of additional regions, wherein each additional region is separated from adjacent regions by an additional unlined trench disposed in the semiconductor material layer, each additional trench having sidewalls comprised of the semiconductor material, wherein each additional trench is sealed with a sealing material such that each additional trench is air-tight.

\* \* \* \* \*